United States Patent
Haddad et al.

(10) Patent No.: US 9,673,250 B2
(45) Date of Patent: *Jun. 6, 2017

(54) SHALLOW TRENCH TEXTURED REGIONS AND ASSOCIATED METHODS

(71) Applicant: SiOnyx, LLC, Beverly, MA (US)

(72) Inventors: Homayoon Haddad, Beaverton, OR (US); Jutao Jiang, Tigard, OR (US)

(73) Assignee: SiOnyx, LLC, Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/884,181

(22) Filed: Oct. 15, 2015

(65) Prior Publication Data

US 2016/0035782 A1 Feb. 4, 2016

Related U.S. Application Data

(63) Continuation of application No. 14/084,392, filed on Nov. 19, 2013, now Pat. No. 9,209,345.

(60) Provisional application No. 61/841,326, filed on Jun. 29, 2013.

(51) Int. Cl.
| | |
|---|---|
| *H01L 27/146* | (2006.01) |
| *H01L 31/028* | (2006.01) |
| *H01L 31/18* | (2006.01) |
| *H01L 31/0232* | (2014.01) |

(52) U.S. Cl.
CPC .... *H01L 27/14643* (2013.01); *H01L 27/1463* (2013.01); *H01L 27/1464* (2013.01); *H01L 27/14625* (2013.01); *H01L 27/14629* (2013.01); *H01L 27/14632* (2013.01);
(Continued)

(58) Field of Classification Search
CPC ........... H01L 21/3065; H01L 21/76898; H01L 21/76224; H01L 21/76816; H01L 31/0232; H01L 31/0236; H01L 31/0352; H01L 31/028; H01L 31/182; H01L 27/14625;
(Continued)

(56) References Cited

U.S. PATENT DOCUMENTS

| | | | |
|---|---|---|---|
| 3,487,223 | A | 12/1969 | St. John |
| 3,922,571 | A | 11/1975 | Smith |
| 3,973,994 | A | 8/1976 | Redfield |

(Continued)

FOREIGN PATENT DOCUMENTS

| | | |
|---|---|---|
| AU | 3666484 | 6/1985 |
| EP | 0473439 | 3/1992 |

(Continued)

OTHER PUBLICATIONS

International Search Report mailed Mar. 31, 2014 in PCT Application PCT/US2013/070842 filed Nov. 19, 2013 (3 pages).

(Continued)

*Primary Examiner* — Caridad Everhart
(74) *Attorney, Agent, or Firm* — Thomas J. Engellenner; Reza Mollaaghababa; Pepper Hamilton LLP

(57) ABSTRACT

Photosensitive devices and associated methods are provided. In one aspect, for example, a photosensitive imager device can include a semiconductor layer having multiple doped regions forming a least one junction, a textured region coupled to the semiconductor layer and positioned to interact with electromagnetic radiation. The textured region can be formed from a series of shallow trench isolation features.

24 Claims, 3 Drawing Sheets

(52) U.S. Cl.
CPC ...... *H01L 27/14689* (2013.01); *H01L 31/028* (2013.01); *H01L 31/02327* (2013.01); *H01L 31/182* (2013.01)

(58) Field of Classification Search
CPC ........... H01L 27/14632; H01L 27/1464; H01L 27/14689; H01L 27/14643
See application file for complete search history.

(56) References Cited

U.S. PATENT DOCUMENTS

| | | | |
|---|---|---|---|
| 3,994,012 A | 11/1976 | Warner, Jr. | |
| 4,017,887 A | 4/1977 | Davies et al. | |
| 4,149,174 A | 4/1979 | Shannon | |
| 4,176,365 A | 11/1979 | Kroger | |
| 4,201,450 A | 5/1980 | Trapani | |
| 4,242,149 A | 12/1980 | King et al. | |
| 4,253,882 A | 3/1981 | Dalal | |
| 4,277,793 A | 7/1981 | Webb | |
| 4,322,571 A | 3/1982 | Stanbery | |
| 4,419,533 A | 12/1983 | Czubatyj et al. | |
| 4,452,826 A | 6/1984 | Shields et al. | |
| 4,493,942 A | 1/1985 | Sheng et al. | |
| 4,514,582 A | 4/1985 | Tiedje et al. | |
| 4,536,608 A | 8/1985 | Sheng et al. | |
| 4,568,960 A | 2/1986 | Petroff et al. | |
| 4,593,303 A | 6/1986 | Dyck et al. | |
| 4,593,313 A | 6/1986 | Nagasaki | |
| 4,617,593 A | 10/1986 | Dudley | |
| 4,630,082 A | 12/1986 | Sakai | |
| 4,648,936 A | 3/1987 | Ashby et al. | |
| 4,663,188 A | 5/1987 | Kane | |
| 4,673,770 A | 6/1987 | Mandelkorn | |
| 4,679,068 A | 7/1987 | Lillquist et al. | |
| 4,751,571 A | 6/1988 | Lillquist | |
| 4,775,425 A | 10/1988 | Guha et al. | |
| 4,777,490 A | 10/1988 | Sharma et al. | |
| 4,829,013 A | 5/1989 | Yamazaki | |
| 4,883,962 A | 11/1989 | Elliot | |
| 4,887,255 A | 12/1989 | Handa et al. | |
| 4,894,526 A | 1/1990 | Bethea et al. | |
| 4,910,568 A | 3/1990 | Taki et al. | |
| 4,910,588 A | 3/1990 | Kinoshita et al. | |
| 4,964,134 A | 10/1990 | Westbrook et al. | |
| 4,965,784 A | 10/1990 | Land et al. | |
| 4,968,372 A | 11/1990 | Maass | |
| 4,999,308 A | 3/1991 | Nishiura et al. | |
| 5,021,100 A | 6/1991 | Ishihara et al. | |
| 5,021,854 A | 6/1991 | Huth | |
| 5,080,725 A | 1/1992 | Green et al. | |
| 5,081,049 A | 1/1992 | Green et al. | |
| 5,100,478 A * | 3/1992 | Kawabata | H01L 31/061 136/249 |
| 5,101,260 A | 3/1992 | Nath | |
| 5,114,876 A | 5/1992 | Weiner | |
| 5,127,964 A | 7/1992 | Hamakawa et al. | |
| 5,164,324 A | 11/1992 | Russell et al. | |
| 5,208,822 A | 5/1993 | Haus et al. | |
| 5,223,043 A | 6/1993 | Olson et al. | |
| 5,234,790 A | 8/1993 | Lang et al. | |
| 5,244,817 A | 9/1993 | Hawkins et al. | |
| 5,296,045 A | 3/1994 | Banerjee et al. | |
| 5,309,275 A | 5/1994 | Nishimura et al. | |
| 5,322,988 A | 6/1994 | Russell et al. | |
| 5,346,850 A | 9/1994 | Kaschmitter et al. | |
| 5,370,747 A * | 12/1994 | Noguchi | H01L 31/0236 136/256 |
| 5,373,182 A | 12/1994 | Norton | |
| 5,381,431 A | 1/1995 | Zayhowski | |
| 5,383,217 A | 1/1995 | Uemura | |
| 5,390,201 A | 2/1995 | Tomono et al. | |
| 5,413,100 A | 5/1995 | Barthelemy et al. | |
| 5,449,626 A | 9/1995 | Hezel | |
| 5,454,347 A | 10/1995 | Shibata et al. | |
| 5,502,329 A | 3/1996 | Pezzani | |
| 5,523,570 A | 6/1996 | Hairston | |
| 5,559,361 A | 9/1996 | Pezzani | |
| 5,569,615 A | 10/1996 | Yamazaki et al. | |
| 5,578,858 A | 11/1996 | Mueller et al. | |
| 5,580,615 A | 12/1996 | Itoh et al. | |
| 5,589,008 A | 12/1996 | Kepper | |
| 5,589,704 A | 12/1996 | Levine | |
| 5,597,621 A | 1/1997 | Hummel et al. | |
| 5,600,130 A | 2/1997 | VanZeghbroeck | |
| 5,626,687 A | 5/1997 | Campbell | |
| 5,627,081 A | 5/1997 | Tsuo et al. | |
| 5,635,089 A | 6/1997 | Singh et al. | |
| 5,640,013 A | 6/1997 | Ishikawa et al. | |
| 5,641,362 A | 6/1997 | Meier | |
| 5,705,413 A | 1/1998 | Harkin et al. | |
| 5,705,828 A | 1/1998 | Noguchi et al. | |
| 5,708,486 A | 1/1998 | Miyawaki et al. | |
| 5,710,442 A | 1/1998 | Watanabe et al. | |
| 5,714,404 A | 2/1998 | Mititsky et al. | |
| 5,727,096 A | 3/1998 | Ghirardi et al. | |
| 5,731,213 A | 3/1998 | Ono | |
| 5,751,005 A | 5/1998 | Wyles et al. | |
| 5,758,644 A | 6/1998 | Diab et al. | |
| 5,766,127 A | 6/1998 | Pologe et al. | |
| 5,766,964 A | 6/1998 | Rohatgi et al. | |
| 5,773,820 A | 6/1998 | Osajda et al. | |
| 5,779,631 A | 7/1998 | Chance | |
| 5,781,392 A | 7/1998 | Clark | |
| 5,792,280 A | 8/1998 | Ruby et al. | |
| 5,808,350 A | 9/1998 | Jack et al. | |
| 5,859,446 A | 1/1999 | Nagasu et al. | |
| 5,861,639 A | 1/1999 | Bernier | |
| 5,923,071 A | 7/1999 | Saito | |
| 5,935,320 A | 8/1999 | Graf et al. | |
| 5,942,789 A | 8/1999 | Morikawa | |
| 5,943,584 A | 8/1999 | Shim et al. | |
| 5,963,790 A | 10/1999 | Matsuno et al. | |
| 5,977,603 A | 11/1999 | Ishikawa | |
| 6,071,796 A | 6/2000 | Voutsas | |
| 6,072,117 A | 6/2000 | Matsuyama et al. | |
| 6,080,988 A | 6/2000 | Ishizuya et al. | |
| 6,082,858 A | 7/2000 | Grace et al. | |
| 6,097,031 A | 8/2000 | Cole | |
| 6,106,689 A | 8/2000 | Matsuyama | |
| 6,107,618 A | 8/2000 | Fossum et al. | |
| 6,111,300 A | 8/2000 | Cao et al. | |
| 6,147,297 A | 11/2000 | Wettling et al. | |
| 6,160,833 A | 12/2000 | Floyd et al. | |
| 6,168,965 B1 | 1/2001 | Malinovich et al. | |
| 6,194,722 B1 | 2/2001 | Fiorini et al. | |
| 6,204,506 B1 | 3/2001 | Akahori et al. | |
| 6,229,192 B1 | 5/2001 | Gu | |
| 6,252,256 B1 | 6/2001 | Ugge et al. | |
| 6,290,713 B1 | 9/2001 | Russell | |
| 6,291,302 B1 | 9/2001 | Yu | |
| 6,313,901 B1 | 11/2001 | Cacharelis | |
| 6,320,296 B1 | 11/2001 | Fujii et al. | |
| 6,331,445 B1 | 12/2001 | Janz et al. | |
| 6,372,591 B1 | 4/2002 | Mineji et al. | |
| 6,372,611 B1 | 4/2002 | Horikawa | |
| 6,379,979 B1 | 4/2002 | Connolly | |
| 6,420,706 B1 | 7/2002 | Lurie et al. | |
| 6,429,036 B1 | 8/2002 | Nixon et al. | |
| 6,429,037 B1 | 8/2002 | Wenham et al. | |
| 6,465,860 B2 | 10/2002 | Shigenaka et al. | |
| 6,475,839 B2 | 11/2002 | Zhang et al. | |
| 6,483,116 B1 | 11/2002 | Kozlowski et al. | |
| 6,483,929 B1 | 11/2002 | Marakami et al. | |
| 6,486,522 B1 | 11/2002 | Bishay et al. | |
| 6,493,567 B1 | 12/2002 | Krivitski et al. | |
| 6,498,336 B1 | 12/2002 | Tian et al. | |
| 6,500,690 B1 | 12/2002 | Yamagishi et al. | |
| 6,504,178 B2 | 1/2003 | Carlson et al. | |
| 6,580,053 B1 | 6/2003 | Voutsas | |
| 6,583,936 B1 | 6/2003 | Kaminsky et al. | |
| 6,597,025 B2 | 7/2003 | Lauter et al. | |
| 6,607,927 B2 | 8/2003 | Ramappa et al. | |
| 6,624,049 B1 | 9/2003 | Yamazaki | |
| 6,639,253 B2 | 10/2003 | Duane et al. | |

(56) References Cited

U.S. PATENT DOCUMENTS

| | | |
|---|---|---|
| 6,667,528 B2 | 12/2003 | Cohen et al. |
| 6,677,655 B2 | 1/2004 | Fitzgerald |
| 6,677,656 B2 | 1/2004 | François |
| 6,683,326 B2 | 1/2004 | Iguchi et al. |
| 6,689,209 B2 | 2/2004 | Falster et al. |
| 6,753,585 B1 | 6/2004 | Kindt |
| 6,759,262 B2 | 7/2004 | Theil et al. |
| 6,790,701 B2 | 9/2004 | Shigenaka et al. |
| 6,800,541 B2 | 10/2004 | Okumura |
| 6,801,799 B2 | 10/2004 | Mendelson |
| 6,803,555 B1 | 10/2004 | Parrish et al. |
| 6,815,685 B2 | 11/2004 | Wany |
| 6,818,535 B2 | 11/2004 | Lu et al. |
| 6,822,313 B2 | 11/2004 | Matsushita |
| 6,825,057 B1 | 11/2004 | Heyers et al. |
| 6,864,156 B1 | 3/2005 | Conn |
| 6,864,190 B2 | 3/2005 | Han et al. |
| 6,867,806 B1 | 3/2005 | Lee et al. |
| 6,900,839 B1 | 5/2005 | Kozlowski et al. |
| 6,907,135 B2 | 6/2005 | Gifford |
| 6,911,375 B2 | 6/2005 | Guarini et al. |
| 6,919,587 B2 | 7/2005 | Ballon et al. |
| 6,923,625 B2 | 8/2005 | Sparks |
| 6,927,432 B2 | 8/2005 | Holm et al. |
| 6,984,816 B2 | 1/2006 | Holm et al. |
| 7,008,854 B2 | 3/2006 | Forbes |
| 7,041,525 B2 | 5/2006 | Clevenger et al. |
| 7,057,256 B2 | 6/2006 | Carey, III et al. |
| 7,075,079 B2 | 7/2006 | Wood |
| 7,091,411 B2 | 8/2006 | Falk et al. |
| 7,109,517 B2 | 9/2006 | Zaidi |
| 7,126,212 B2 | 10/2006 | Enquist et al. |
| 7,132,724 B1 | 11/2006 | Merrill |
| 7,202,102 B2 | 4/2007 | Yao |
| 7,211,501 B2 | 5/2007 | Liu et al. |
| 7,235,812 B2 | 6/2007 | Chu et al. |
| 7,247,527 B2 | 7/2007 | Shimomura et al. |
| 7,247,812 B2 | 7/2007 | Tsao |
| 7,256,102 B2 | 8/2007 | Nakata et al. |
| 7,271,445 B2 | 9/2007 | Forbes |
| 7,271,835 B2 | 9/2007 | Iizuka et al. |
| 7,285,482 B2 | 10/2007 | Ochi |
| 7,314,832 B2 | 1/2008 | Kountz et al. |
| 7,354,792 B2 | 4/2008 | Carey, III et al. |
| 7,358,498 B2 | 4/2008 | Geng et al. |
| 7,375,378 B2 | 5/2008 | Manivannan et al. |
| 7,390,689 B2 | 6/2008 | Mazur et al. |
| 7,432,148 B2 | 10/2008 | Li et al. |
| 7,442,629 B2 | 10/2008 | Mazur et al. |
| 7,446,359 B2 | 11/2008 | Lee et al. |
| 7,446,807 B2 | 11/2008 | Hong |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Mazur et al. |
| 7,511,750 B2 | 3/2009 | Murakami |
| 7,521,737 B2 | 4/2009 | Augusto |
| 7,528,463 B2 | 5/2009 | Forbes |
| 7,542,085 B2 | 6/2009 | Altice, Jr. et al. |
| 7,547,616 B2 | 6/2009 | Fogel et al. |
| 7,551,059 B2 | 6/2009 | Farrier |
| 7,560,750 B2 | 7/2009 | Niira et al. |
| 7,564,631 B2 | 7/2009 | Li et al. |
| 7,582,515 B2 | 9/2009 | Choi et al. |
| 7,592,593 B2 | 9/2009 | Kauffman et al. |
| 7,595,213 B2 | 9/2009 | Kwon et al. |
| 7,605,397 B2 | 10/2009 | Kindem et al. |
| 7,615,808 B2 | 11/2009 | Pain et al. |
| 7,618,839 B2 | 11/2009 | Rhodes |
| 7,619,269 B2 | 11/2009 | Ohkawa |
| 7,629,582 B2 | 12/2009 | Hoffman et al. |
| 7,648,851 B2 | 1/2010 | Fu et al. |
| 7,649,156 B2 | 1/2010 | Lee |
| 7,705,879 B2 | 4/2010 | Kerr et al. |
| 7,731,665 B2 | 6/2010 | Lee et al. |
| 7,741,666 B2 | 6/2010 | Nozaki et al. |
| 7,745,901 B1 | 6/2010 | McCaffrey et al. |
| 7,763,913 B2 | 7/2010 | Fan et al. |
| 7,772,028 B2 | 8/2010 | Adkisson et al. |
| 7,781,856 B2 | 8/2010 | Mazur et al. |
| 7,800,192 B2 | 9/2010 | Venezia et al. |
| 7,800,684 B2 | 9/2010 | Tatani |
| 7,816,220 B2 | 10/2010 | Mazur et al. |
| 7,828,983 B2 * | 11/2010 | Weber .............. H01L 31/02363 216/17 |
| 7,847,253 B2 | 12/2010 | Carey et al. |
| 7,847,326 B2 | 12/2010 | Park et al. |
| 7,855,406 B2 | 12/2010 | Yamaguchi et al. |
| 7,875,498 B2 | 1/2011 | Elbanhawy et al. |
| 7,880,168 B2 | 2/2011 | Lenchenkov |
| 7,884,439 B2 | 2/2011 | Mazur et al. |
| 7,884,446 B2 | 2/2011 | Mazur et al. |
| 7,910,964 B2 | 3/2011 | Kawahito et al. |
| 7,923,801 B2 | 4/2011 | Tian et al. |
| 7,968,834 B2 | 6/2011 | Veeder |
| 8,008,205 B2 | 8/2011 | Fukushima et al. |
| 8,013,411 B2 | 9/2011 | Cole |
| 8,030,726 B2 | 10/2011 | Sumi |
| 8,035,343 B2 | 10/2011 | Seman, Jr. |
| 8,058,615 B2 | 11/2011 | McCaffrey |
| 8,080,467 B2 | 12/2011 | Carey et al. |
| 8,088,219 B2 | 1/2012 | Knerer et al. |
| 8,093,559 B1 | 1/2012 | Rajavel |
| RE43,169 E | 2/2012 | Parker |
| 8,164,126 B2 | 4/2012 | Moon et al. |
| 8,207,051 B2 | 6/2012 | Sickler et al. |
| 8,247,259 B2 | 8/2012 | Grolier et al. |
| 8,259,293 B2 | 9/2012 | Andreou et al. |
| 8,288,702 B2 | 10/2012 | Veeder |
| 8,476,681 B2 | 7/2013 | Haddad et al. |
| 8,564,087 B2 | 10/2013 | Yamamura et al. |
| 8,603,902 B2 | 12/2013 | Mazer et al. |
| 8,629,485 B2 | 1/2014 | Yamamura et al. |
| 8,680,591 B2 | 3/2014 | Haddad et al. |
| 8,742,528 B2 | 6/2014 | Yamamura et al. |
| 8,884,226 B2 | 11/2014 | Miyazaki et al. |
| 8,916,945 B2 | 12/2014 | Sakamoto et al. |
| 8,994,135 B2 | 3/2015 | Yamamura et al. |
| 9,184,204 B2 | 11/2015 | Hu |
| 9,190,551 B2 | 11/2015 | Yamamura et al. |
| 9,209,345 B2 * | 12/2015 | Haddad ............. H01L 27/14625 |
| 9,369,641 B2 | 6/2016 | Hu |
| 2001/0017344 A1 | 8/2001 | Aebi |
| 2001/0022768 A1 | 9/2001 | Takahashi |
| 2001/0044175 A1 | 11/2001 | Barret et al. |
| 2002/0020893 A1 | 2/2002 | Lhorte |
| 2002/0024618 A1 | 2/2002 | Imai |
| 2002/0056845 A1 | 5/2002 | Iguchi et al. |
| 2002/0060322 A1 | 5/2002 | Tanabe et al. |
| 2002/0079290 A1 | 6/2002 | Holdermann |
| 2002/0117699 A1 | 8/2002 | Francois |
| 2002/0148964 A1 | 10/2002 | Dausch et al. |
| 2002/0182769 A1 | 12/2002 | Campbell |
| 2003/0029495 A1 | 2/2003 | Mazur et al. |
| 2003/0030083 A1 | 2/2003 | Lee et al. |
| 2003/0045092 A1 | 3/2003 | Shin |
| 2003/0057357 A1 | 3/2003 | Uppal et al. |
| 2003/0111106 A1 | 6/2003 | Nagano et al. |
| 2003/0210332 A1 | 11/2003 | Frame |
| 2003/0213515 A1 | 11/2003 | Sano et al. |
| 2003/0214595 A1 | 11/2003 | Mabuchi |
| 2003/0228883 A1 | 12/2003 | Kusakari et al. |
| 2004/0014307 A1 | 1/2004 | Shin et al. |
| 2004/0016886 A1 | 1/2004 | Ringermacher et al. |
| 2004/0041168 A1 | 3/2004 | Hembree et al. |
| 2004/0046224 A1 | 3/2004 | Rossel et al. |
| 2004/0077117 A1 | 4/2004 | Ding et al. |
| 2004/0080638 A1 | 4/2004 | Lee |
| 2004/0130020 A1 | 7/2004 | Kuwabara et al. |
| 2004/0161868 A1 | 8/2004 | Hong |
| 2004/0222187 A1 | 11/2004 | Lin |
| 2004/0252931 A1 | 12/2004 | Belleville et al. |
| 2005/0051822 A1 | 3/2005 | Manning |

(56) References Cited

U.S. PATENT DOCUMENTS

| | | |
|---|---|---|
| 2005/0062041 A1 | 3/2005 | Terakawa et al. |
| 2005/0093100 A1* | 5/2005 | Chen .............. H01L 21/76254 257/616 |
| 2005/0101100 A1 | 5/2005 | Kretchmer et al. |
| 2005/0101160 A1 | 5/2005 | Garg et al. |
| 2005/0127401 A1 | 6/2005 | Mazur et al. |
| 2005/0134698 A1 | 6/2005 | Schroeder et al. |
| 2005/0150542 A1 | 7/2005 | Madan |
| 2005/0158969 A1 | 7/2005 | Binnis et al. |
| 2005/0211996 A1 | 9/2005 | Krishna et al. |
| 2005/0227390 A1 | 10/2005 | Shtein et al. |
| 2006/0006482 A1 | 1/2006 | Rieve et al. |
| 2006/0011954 A1 | 1/2006 | Ueda et al. |
| 2006/0011955 A1 | 1/2006 | Baggenstoss |
| 2006/0060848 A1 | 3/2006 | Chang et al. |
| 2006/0071254 A1 | 4/2006 | Rhodes |
| 2006/0079062 A1 | 4/2006 | Mazur et al. |
| 2006/0086956 A1 | 4/2006 | Furukawa et al. |
| 2006/0118781 A1 | 6/2006 | Rhodes |
| 2006/0121680 A1 | 6/2006 | Tanaka |
| 2006/0128087 A1 | 6/2006 | Bamji et al. |
| 2006/0132633 A1 | 6/2006 | Nam et al. |
| 2006/0138396 A1 | 6/2006 | Lin et al. |
| 2006/0145148 A1 | 7/2006 | Hirai et al. |
| 2006/0145176 A1 | 7/2006 | Lee |
| 2006/0160343 A1 | 7/2006 | Chong et al. |
| 2006/0166475 A1 | 7/2006 | Mantl |
| 2006/0175529 A1 | 8/2006 | Harmon et al. |
| 2006/0180885 A1 | 8/2006 | Rhodes |
| 2006/0181627 A1 | 8/2006 | Farrier |
| 2006/0214121 A1 | 9/2006 | Schrey et al. |
| 2006/0228897 A1 | 10/2006 | Timans |
| 2006/0231914 A1 | 10/2006 | Carey et al. |
| 2006/0238632 A1 | 10/2006 | Shah |
| 2006/0244090 A1 | 11/2006 | Roy et al. |
| 2006/0255340 A1 | 11/2006 | Manivannan et al. |
| 2006/0257140 A1 | 11/2006 | Seger |
| 2007/0035849 A1 | 2/2007 | Li et al. |
| 2007/0035879 A1 | 2/2007 | Hall et al. |
| 2007/0051876 A1 | 3/2007 | Sumi et al. |
| 2007/0052050 A1 | 3/2007 | Dierickx |
| 2007/0076481 A1 | 4/2007 | Tennant |
| 2007/0115554 A1 | 5/2007 | Breitung et al. |
| 2007/0123005 A1 | 5/2007 | Hiura et al. |
| 2007/0138590 A1 | 6/2007 | Wells et al. |
| 2007/0145505 A1 | 6/2007 | Kim et al. |
| 2007/0178672 A1 | 8/2007 | Tanaka et al. |
| 2007/0187670 A1 | 8/2007 | Hsu et al. |
| 2007/0189583 A1 | 8/2007 | Shimada et al. |
| 2007/0194356 A1 | 8/2007 | Moon et al. |
| 2007/0194401 A1 | 8/2007 | Nagai et al. |
| 2007/0195056 A1 | 8/2007 | Lloyd |
| 2007/0200940 A1 | 8/2007 | Gruhlke et al. |
| 2007/0201859 A1 | 8/2007 | Sarrat |
| 2007/0235827 A1 | 10/2007 | Altice |
| 2007/0237504 A1 | 10/2007 | Nakashiba |
| 2007/0247414 A1 | 10/2007 | Roberts |
| 2007/0262366 A1 | 11/2007 | Baek et al. |
| 2007/0290283 A1 | 12/2007 | Park et al. |
| 2007/0296060 A1 | 12/2007 | Tanabe et al. |
| 2008/0020555 A1 | 1/2008 | Shimomura et al. |
| 2008/0026550 A1 | 1/2008 | Werner et al. |
| 2008/0036022 A1 | 2/2008 | Hwang et al. |
| 2008/0044943 A1 | 2/2008 | Mazur et al. |
| 2008/0076240 A1 | 3/2008 | Veschtti et al. |
| 2008/0099804 A1 | 5/2008 | Venezia |
| 2008/0121280 A1 | 5/2008 | Carnel et al. |
| 2008/0121805 A1 | 5/2008 | Tweet et al. |
| 2008/0158398 A1 | 7/2008 | Yaffe et al. |
| 2008/0170173 A1 | 7/2008 | Park et al. |
| 2008/0174685 A1 | 7/2008 | Shan et al. |
| 2008/0178932 A1 | 7/2008 | Den Boer et al. |
| 2008/0179762 A1 | 7/2008 | Cho et al. |
| 2008/0191310 A1 | 8/2008 | Wu et al. |
| 2008/0192132 A1 | 8/2008 | Bechtel et al. |
| 2008/0192133 A1 | 8/2008 | Abiru et al. |
| 2008/0196761 A1 | 8/2008 | Nakano et al. |
| 2008/0198251 A1 | 8/2008 | Xu et al. |
| 2008/0202576 A1 | 8/2008 | Hieslmair |
| 2008/0213936 A1 | 9/2008 | Hatai |
| 2008/0223436 A1 | 9/2008 | den Boer et al. |
| 2008/0242005 A1 | 10/2008 | Dozen et al. |
| 2008/0257409 A1 | 10/2008 | Li et al. |
| 2008/0258604 A1 | 10/2008 | Mazur et al. |
| 2008/0266434 A1 | 10/2008 | Sugawa et al. |
| 2008/0266435 A1 | 10/2008 | Agranov et al. |
| 2008/0281174 A1 | 11/2008 | Dietiker |
| 2008/0284884 A1 | 11/2008 | Makino et al. |
| 2008/0309913 A1 | 12/2008 | Fallon |
| 2009/0002528 A1 | 1/2009 | Manabe et al. |
| 2009/0014056 A1 | 1/2009 | Hockaday |
| 2009/0038669 A1 | 2/2009 | Atanackovic |
| 2009/0039397 A1 | 2/2009 | Chao |
| 2009/0050944 A1 | 2/2009 | Hong |
| 2009/0056797 A1 | 3/2009 | Barnett et al. |
| 2009/0057536 A1 | 3/2009 | Hirose |
| 2009/0065051 A1 | 3/2009 | Chan et al. |
| 2009/0078316 A1 | 3/2009 | Khazeni et al. |
| 2009/0095887 A1 | 4/2009 | Saveliev |
| 2009/0097290 A1 | 4/2009 | Chandrasekaran |
| 2009/0109305 A1 | 4/2009 | Dai et al. |
| 2009/0142879 A1 | 6/2009 | Isaka et al. |
| 2009/0146240 A1 | 6/2009 | Carey, III et al. |
| 2009/0160983 A1 | 6/2009 | Lenchenkov |
| 2009/0180010 A1 | 7/2009 | Adikisson et al. |
| 2009/0194671 A1 | 8/2009 | Nozaki et al. |
| 2009/0200454 A1 | 8/2009 | Barbier et al. |
| 2009/0200586 A1 | 8/2009 | Mao et al. |
| 2009/0200626 A1 | 8/2009 | Qian et al. |
| 2009/0200631 A1 | 8/2009 | Tai et al. |
| 2009/0206237 A1 | 8/2009 | Shannon et al. |
| 2009/0211627 A1 | 8/2009 | Meier et al. |
| 2009/0213883 A1 | 8/2009 | Mazur et al. |
| 2009/0218493 A1 | 9/2009 | McCaffrey et al. |
| 2009/0223561 A1 | 9/2009 | Kim et al. |
| 2009/0227061 A1 | 9/2009 | Bateman et al. |
| 2009/0242032 A1 | 10/2009 | Yamazaki et al. |
| 2009/0242933 A1 | 10/2009 | Hu et al. |
| 2009/0256156 A1 | 10/2009 | Hsieh |
| 2009/0256226 A1* | 10/2009 | Tatani .............. H01L 27/14831 257/432 |
| 2009/0261255 A1 | 10/2009 | Nakamura et al. |
| 2009/0283807 A1 | 11/2009 | Adkisson et al. |
| 2009/0294787 A1 | 12/2009 | Nakaji et al. |
| 2009/0308450 A1 | 12/2009 | Adibi et al. |
| 2010/0000597 A1 | 1/2010 | Cousins |
| 2010/0013036 A1 | 1/2010 | Carey |
| 2010/0013039 A1 | 1/2010 | Qian et al. |
| 2010/0013593 A1 | 1/2010 | Luckhardt |
| 2010/0024871 A1 | 2/2010 | Oh et al. |
| 2010/0032008 A1 | 2/2010 | Adekore |
| 2010/0037952 A1 | 2/2010 | Lin |
| 2010/0038523 A1 | 2/2010 | Venezia et al. |
| 2010/0038542 A1 | 2/2010 | Carey et al. |
| 2010/0040981 A1 | 2/2010 | Kiesel et al. |
| 2010/0044552 A1 | 2/2010 | Chen |
| 2010/0051809 A1 | 3/2010 | Onat et al. |
| 2010/0052088 A1 | 3/2010 | Carey |
| 2010/0053382 A1 | 3/2010 | Kuniba |
| 2010/0055887 A1 | 3/2010 | Piwczyk |
| 2010/0059385 A1 | 3/2010 | Li |
| 2010/0059803 A1* | 3/2010 | Gidon .............. H01L 27/14625 257/292 |
| 2010/0072349 A1 | 3/2010 | Veeder |
| 2010/0074396 A1 | 3/2010 | Schmand et al. |
| 2010/0083997 A1 | 4/2010 | Hovel |
| 2010/0084009 A1 | 4/2010 | Carlson et al. |
| 2010/0096718 A1 | 4/2010 | Hynecek et al. |
| 2010/0097609 A1 | 4/2010 | Jaeger et al. |
| 2010/0102206 A1 | 4/2010 | Cazaux et al. |
| 2010/0109060 A1 | 5/2010 | Mao et al. |
| 2010/0116312 A1 | 5/2010 | Peumans et al. |
| 2010/0117181 A1 | 5/2010 | Kim et al. |
| 2010/0118172 A1 | 5/2010 | McCarten et al. |

(56) References Cited

U.S. PATENT DOCUMENTS

| | | |
|---|---|---|
| 2010/0128937 A1 | 5/2010 | Yoo et al. |
| 2010/0133635 A1 | 6/2010 | Lee et al. |
| 2010/0140733 A1 | 6/2010 | Lee et al. |
| 2010/0143744 A1 | 6/2010 | Gupta |
| 2010/0147383 A1 | 6/2010 | Carey et al. |
| 2010/0200658 A1 | 8/2010 | Olmstead et al. |
| 2010/0219506 A1 | 9/2010 | Gupta |
| 2010/0224229 A1 | 9/2010 | Pralle et al. |
| 2010/0240169 A1 | 9/2010 | Petti et al. |
| 2010/0245647 A1 | 9/2010 | Honda et al. |
| 2010/0258176 A1 | 10/2010 | Kang et al. |
| 2010/0264473 A1 | 10/2010 | Adkisson et al. |
| 2010/0289885 A1 | 11/2010 | Lu et al. |
| 2010/0290668 A1 | 11/2010 | Friedman et al. |
| 2010/0300505 A1 | 12/2010 | Chen |
| 2010/0300507 A1 | 12/2010 | Heng et al. |
| 2010/0313932 A1 | 12/2010 | Kroll et al. |
| 2011/0056544 A1 | 3/2011 | Ji et al. |
| 2011/0073976 A1 | 3/2011 | Vaillant |
| 2011/0095387 A1 | 4/2011 | Carey et al. |
| 2011/0104850 A1 | 5/2011 | Weidman et al. |
| 2011/0127567 A1 | 6/2011 | Seong |
| 2011/0140221 A1 | 6/2011 | Venezia et al. |
| 2011/0194100 A1 | 8/2011 | Thiel et al. |
| 2011/0220971 A1 | 9/2011 | Haddad |
| 2011/0227138 A1 | 9/2011 | Haddad |
| 2011/0251478 A1 | 10/2011 | Wieczorek |
| 2011/0260059 A1 | 10/2011 | Jiang et al. |
| 2011/0266644 A1 | 11/2011 | Yamamura et al. |
| 2011/0292380 A1 | 12/2011 | Bamji |
| 2011/0303999 A1 | 12/2011 | Sakamoto et al. |
| 2012/0024363 A1 | 2/2012 | Dimer et al. |
| 2012/0024364 A1 | 2/2012 | Carey, III et al. |
| 2012/0038811 A1 | 2/2012 | Ellis-monaghan et al. |
| 2012/0043637 A1 | 2/2012 | King et al. |
| 2012/0049242 A1 | 3/2012 | Atanackovic et al. |
| 2012/0111396 A1 | 5/2012 | Saylor et al. |
| 2012/0171804 A1 | 7/2012 | Moslehi et al. |
| 2012/0187190 A1 | 7/2012 | Wang et al. |
| 2012/0222396 A1 | 9/2012 | Clemen |
| 2012/0291859 A1 | 11/2012 | Vineis et al. |
| 2012/0300037 A1 | 11/2012 | Laudo |
| 2012/0305063 A1 | 12/2012 | Moslehi et al. |
| 2012/0312304 A1 | 12/2012 | Lynch et al. |
| 2012/0313204 A1 | 12/2012 | Haddad et al. |
| 2012/0313205 A1 | 12/2012 | Haddad et al. |
| 2012/0326008 A1 | 12/2012 | Mckee et al. |
| 2013/0001553 A1 | 1/2013 | Vineis et al. |
| 2013/0082343 A1 | 4/2013 | Fudaba et al. |
| 2013/0168792 A1 | 7/2013 | Haddad et al. |
| 2013/0168803 A1 | 7/2013 | Haddad et al. |
| 2013/0200251 A1 | 8/2013 | Velichko |
| 2013/0207214 A1 | 8/2013 | Haddad et al. |
| 2013/0285130 A1* | 10/2013 | Ting ............ H01L 27/146 257/291 |
| 2014/0198240 A1 | 7/2014 | Rhoads |
| 2014/0247378 A1 | 9/2014 | Sharma et al. |

FOREIGN PATENT DOCUMENTS

| | | |
|---|---|---|
| EP | 0566156 | 10/1993 |
| EP | 1630871 | 1/2006 |
| EP | 1873840 | 1/2008 |
| EP | 2073270 | 5/2012 |
| FR | 2827707 | 1/2003 |
| GB | 2030766 | 4/1980 |
| JP | S5771188 | 5/1982 |
| JP | S57173966 | 10/1982 |
| JP | S63116421 | 5/1988 |
| JP | H02152226 | 6/1990 |
| JP | H02237026 | 9/1990 |
| JP | H03183037 | 8/1991 |
| JP | H04318970 | 11/1992 |
| JP | H06104414 | 4/1994 |
| JP | H06244444 | 9/1994 |
| JP | H06267868 | 9/1994 |
| JP | H06275641 | 9/1994 |
| JP | H07183484 | 7/1995 |
| JP | 9148594 | 6/1997 |
| JP | H09298308 | 11/1997 |
| JP | 11077348 | 3/1999 |
| JP | 11097724 | 4/1999 |
| JP | 2000164914 | 6/2000 |
| JP | 2001007381 | 1/2001 |
| JP | 2001024936 | 1/2001 |
| JP | 2001189478 | 7/2001 |
| JP | 2001257927 | 9/2001 |
| JP | 2001339057 | 12/2001 |
| JP | 2002043594 | 2/2002 |
| JP | 2002134640 | 5/2002 |
| JP | 2003163360 | 6/2003 |
| JP | 2003242125 | 8/2003 |
| JP | 2003308130 | 10/2003 |
| JP | 2004273886 | 9/2004 |
| JP | 2004273887 | 9/2004 |
| JP | 2005339425 | 12/2005 |
| JP | 2006173381 | 6/2006 |
| JP | 2006255430 | 9/2006 |
| JP | 2007165909 | 6/2007 |
| JP | 2007180642 | 7/2007 |
| JP | 2007180643 | 7/2007 |
| JP | 2007305675 | 11/2007 |
| JP | 2008187003 | 8/2008 |
| JP | 2008283219 | 11/2008 |
| JP | 2009021479 | 1/2009 |
| JP | 2010278472 | 12/2010 |
| JP | 2011091128 | 5/2011 |
| KR | 20010061058 | 4/2001 |
| KR | 2005039273 | 4/2005 |
| KR | 100825808 | 4/2008 |
| KR | 20100118864 | 11/2010 |
| KR | 20060052278 | 5/2016 |
| WO | WO 91/14284 | 9/1991 |
| WO | 0031679 | 6/2000 |
| WO | WO 0241363 | 5/2002 |
| WO | WO 03/059390 | 7/2003 |
| WO | WO 2006/086014 | 8/2006 |
| WO | WO 2008091242 | 7/2008 |
| WO | WO 2008099524 | 8/2008 |
| WO | WO 2008145097 | 12/2008 |
| WO | 2009016846 | 2/2009 |
| WO | WO 2009100023 | 8/2009 |
| WO | 2009147085 | 12/2009 |
| WO | WO 2010033127 | 3/2010 |
| WO | WO 2011003871 | 1/2011 |
| WO | WO 2011035188 | 3/2011 |
| WO | WO 2011119618 | 3/2011 |

OTHER PUBLICATIONS

International Report on Patentability and Written Opinion mailed Mar. 31, 2014 in PCT/US2013/070842 filed Nov. 19, 2013 (7pages).
A. Arndt, J.F. Allison, J.G. Haynos, and A. Meulenberg, Jr., "Optical Properties of the COMSAT Non-reflective Cell," 11th IEEE Photovoltaic Spec. Conf., p. 40, 1975.
Asom et al., Interstitial Defect Reactions in Silicon; Appl. Phys. Lett.; Jul. 27, 1987; pp. 256-258; vol. 51(4); American Institute of Physics.
Berger, Michael; Moth Eyes Inspire Self-Cleaning Antireflection Nanotechnology Coatings; 2008; 3 pages; Nanowerk LLC.
Berger, O., Inns, D. and Aberle, A.E. "Commercial White Paint as Back Surface Reflector for Thin-Film Solar Cells", Solar Energy Materials & Solar Cells, vol. 91, pp. 1215-1221,2007.
Betta et al.; Si-PIN X-Ray Detector Technology; Nuclear Instruments and Methods in Physics Research; 1997; pp. 344-348; vol. A, No. 395; Elsevier Science B.V. cited by applicant.
Boden, S.A. et al.; Nanoimprinting for Antireflective Moth-Eye Surfaces; 4 pages; 2008.
Bogue: "From bolometers to beetles: the development of the thermal imaging sensors;" sensor Review; 2007; pp. 278-281; Emerald Group Publishing Limited (ISSN 0260-2288).

(56) References Cited

OTHER PUBLICATIONS

Borghesi et al.; "Oxygen Precipitation in Silicon," J. Appl. Phys., v. 77(9), pp. 4169-4244 (May 1, 1995).
Born, M. and E.Wolf, "Princip les of Optics, 7th Ed.", Cambridge University Press, 1999, pp. 246-255.
Brieger,S., O.Dubbers, S.Fricker, A.Manzke, C.Pfahler, A.Plettl, and P .Zlemann, "An Approach for the Fabrication of Hexagonally Ordered Arrays of Cylindrical Nanoholes in Crystalline and Amorphous Silicon Based on the Self-Organization of Polymer Micelles", Nanotechnology, vol. 17, pp. 4991-4994, 2006, doi:10.1088/0957-4884/17/19/036.
Buttgen, B.; "Demodulation Pixel Based on Static Drift Fields"; IEEE Transactions on Electron Devices, vol. 53, No. 11, Nov. 2006.
Carey et al., "Femtosecond-Laser-Assisted Microstructuring of Silicon Surfaces", Optics and Photonics News, 2003. 14, 32-36.
Carey, et al. "Femtosecond Laser-Assisted Microstructuring of Silicon for Novel Detector, Sensing and Display Technologies", LEOS 2003, 481-482, Tuscon, AR.
Carey, et al. "Femtosecond Laser-Assisted Microstructuring of Silicon for Novel Detector, Sensing and Display Technologies", LEOS; 2002, 97-98, Glasgos, Scotland, 2002.
Carey, et al., "Fabrication of Micrometer-Sized Conical Field Emitters Using Femtosecond Laser-Assisted Etching of Silicon," Proc. IVMC 2001, 75-76, UC Davis, Davis, CA.
Carey, et al., "Field Emission from Silicon. Microstructures Formed by Femtosecond Laser Assisted Etching," Proc. CLEO 2001 (Baltimore, MD 2001) 555-557.
Carey, et al., "High Sensitivity Silicon-Based VIS/NIR Photodetectors", Optical Society of America (2003) 1-2.
Carey, III; "Femtosecond-laser Microstructuring of Silicon for Novel Optoelectronic Devices"; Harvard University, Jul. 2004; (Thesis).
Chang, S.W., V.P .Chuang, S.T .Boles, and C.V.Thompson, "Metal-Catalyzed Etching of Vertically Aligned Polysilicon and Amorphous Silicon Nanowire Arrays by Etching Direction Confinement", Advanced Functional Materials, vol. 20, No. 24, pp. 4364-4370, 2010.
Chen, Q. et al.; Broadband moth-eye antireflection coatings fabricated by low-cost nanoimprinting; Applied Physics Letters 94; pp. 263118-1-263118-3; 2009; American Institute of Physics.
Chien et al, "Pulse Width Effect in Ultrafast Laser Processing of Materials," Applied Physics A, 2005, 1257-1263, 81, Springer Berlin, Heidelberg, Germany.
Chiang, Wen Jen Et al., "Silicon Nanocrystal-Based Photosensor on Low-Temperature Polycrystalline-Silicone Panels", Applied Physics Letters, 2007, 51120-1-51120-3, Ltt. 91, American Inst. of Physics, Melville, NY.
Chichkiv, B.N. et al, "Femtosecond, picosecond and nanosecond laser ablation of solids" Appl. Phys. A 63, 109-115; 1996.
Cilingiroglu et al., "An evaluation of MOS Interface-Trap Charge Pump as and Ultralow Constant-Current Generator," IEEE Journal of Solid-State Circuit, 2003, vol. 38, No. 1, Jan. 2003, 71-83.
Cmosis; "Global Shutter Image Sensors for Machine Vision Application"; Image Sensors Europe 2010, Mar. 23-25, 2010; .COPYRGT. copyright 2010.
Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.
Crouch et al., "Comparison of Structure and Properties of Femtosecond and Nanosecond Laser-Structured Silicon" Appl. Phys. Lett., 2004, 84,1850-1852.
Crouch et al., "Infrared Absorption by Sulfur-Doped Silicon Formed by Femtosecond Laser Irradiation", Appl. Phys. A, 2004, 79, 1635-1641.
Despeisse, et al.; "Thin Film Silicon Solar Cell on Highly Textured Substrates for High Conversion Efficiency"; 2004.
Detection of X-ray and Gamma-ray Photons Using Silicon Diodes; Dec. 2000; Detection Technology, Inc.; Micropolis, Finland.
Dewan, Rahul et al.; Light Trapping in Thin-Film Silicon Solar Cells with Submicron Surface Texture; Optics Express; vol. 17, No. 25; Dec. 7, 2009; Optical Society of America.
Deych et al.; Advances in Computed Tomography and Digital Mammography; Power Point; Nov. 18, 2008; Analogic Corp.; Peabody, MA.
Dobie, et al.; "Minimization of reflected light in photovoltaic modules"; Mar. 1, 2009.
Dobrzanski, L.A. et al.; Laser Surface Treatment of Multicrystalline Silicon for Enhancing Optical Properties; Journal of Materials Processing Technology; p. 291-296; 2007; Elsevier B.V.
Dolgaev et al., "Formation of Conical Microstructures Upon Laser Evaporation of Solids", Appl. Phys. A, 2001, 73, 177-181.
Duerinckx, et al.; "Optical Path Length Enhancement for >13% Screenprinted Thin Film Silicon Solar Cells"; 2006.
Dulinski, Wojciech et al.; Tests of backside illumincated monolithic CMOS pixel sensor in an HPD set-up; Nuclear Instruments and methods in Physics Research; Apr. 19, 2005; pp. 274-280; Elsevier B.V.
Forbes; "Texturing, reflectivity, diffuse scattering and light trapping in silicon solar cells"; 2012.
Forbes, L. and M.Y. Louie, "Backside Nanoscale Texturing to Improve Ir Response of Silicon Photodetectors and Solar Cells," Nanotech, vol. 2, pp. 9-12, Jun. 2010.
Fowlkes et al., "Surface Microstructuring and Long-Range Ordering of Silicon Nanoparticles", Appl. Phys. Lett., 2002, 80 (20), 3799-3801.
Gjessing, J. et al.; 2D back-side diffraction grating for impored light trapping in thin silicon solar cells; Optics Express; vol. 18, No. 6; pp. 5481-5495; Mar. 15, 2010; Optical Society of America.
Gjessing, J. et al.; 2D blazed grating for light trapping in thin silicon solar cells; 3 pages; 2010; Optical Society of America.
Gloeckler et al. Band-Gap Grading in Cu(In,Ga)Se2 Solar Cells, Journal of Physics and Chemistry of Solids; 2005; pp. 189-194; vol. 66.
Goetzberger, et al.; "Solar Energy Materials & Solar Cells"; vol. 92 (2008) pp. 1570-1578.
Han et al., "Evaluation of a Small Negative Transfer Gate Bias on the Performance of 4T CMOS Image Sensor Pixels," 2007 International Image Sensor Workshop, 238-240, Ogunquit, Maine.
Haug, et al.; "Light Trapping effects in thin film silicon solar cells"; 2009.
Her et al., "Microstructuring of Silicon with Femtosecond Laser Pulses," Applied Physics Letters, 1998, 1673-1675, vol. 73, No. 12, American Institute of Physics.
Her et al., "Novel Conical Microstructures Created in Silicon With Femtosecond Laser Pulses", CLEO 1998, 511-512, San Francisco, CA.
Her, et al., "Femtosecond laser-induced formation of spikes on silicon," Applied Physics A, 2000, 70, 383-385.
Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.
High—Performance Technologies for Advanced Biomedical Applications; .COPYRGT. 2004Brochure; pp. 1-46; PerkinElmerOptoelectronics.
Holland; Fabrication of Detectors and Transistors on High-Resistivity Silicon; Nuclear Instruments and Methods in Physics Research, vol. A275, pp. 537-541 (1989).
Hong et al., "Cryogenic processed metal-semiconductor-metal (MSM) photodetectors on MBE grown ZnSe,", 1999, IEEE Transactions on Electron Devices, vol. 46, No. 6, pp. 1127-1134.
Hsieh et al., "Focal-Plane-Arrays and CMOS Readout Techniques of Infrared Imaging Systems," IEE Transactions on Circuits and Systems for Video Technology, 1997, vol. 7, No. 4, Aug. 1997, 594-605.
Hu et al., "Solar Cells from Basic to Advanced Systems," McGraw Hill Book Co., 1983, 39, New York, New York.
Huang, et al.; "Microstructured silicon photodetector"; Applied Physics Letters 89, 033506; 2006 American Institute of Physics; 2006.

(56) References Cited

OTHER PUBLICATIONS

Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.

Igalson et al. Defect States in the CIGS Solar cells by Photocapacitance and Deep Level Optical Spectroscopy; Bulletin of the Polish Academy of Sciences Technical Sciences; 2005; pp. 157-161; vol. 53(2).

"Infrared Absorption by Sulfur-Doped Silicon formed by Femtosecond Laser Irradiation"; Springer Berline/Heidelberg, vol. 79, Nov. 2004.

Job et al., "Doping of Oxidized Float Zone Silincon by Thermal Donors—A low Thermal Budget Doping Method for Device Applications?" Mat. Res. Soc. Symp. Pro.; v. 719, F9.5.1-F9.5.6 (2002).

Joy, T. et al.; Development of a Production-Ready, Back-Illuminated CMOS Image Sensor with Small Pixels; Electron Devices Meeting; pp. 1007-1010; 2007; IEEE.

Juntunen et al.; Advanced Photodiode Detector for Medical CT Imaging: Design and Performance; 2007; pp. 2730-2735; IEEE.

Kim et al.; "Strong Sub-Band-Gap Infrared Absorption in Silicon Supersaturated with Sulfur"; 2006 Appl. Phys. Lett. 88, 241902-1-241902-3.

Kolasinski et al., "Laser Assisted and Wet Chemical Etching of Silicon Nanostructures," J. Vac. Sci. Technol., A 24(4), Jul./Aug. 2006, 1474-1479.

Konstantatos et al., "Engineering the Temproal Response of Photoconductive Photodetectors via Selective Introduction of Surface Trap States," Nano Letters, v. 8(5), pp. 1446-1450 (Apr. 2, 2008).

Konstantatos et al., "PbS Colloidal Quantum Dot Photoconductive Photodetectors: Transport, Traps, and Gain," Appl. Phys. Lett., v. 91, pp. 173505-1-173505-3 (Oct. 23, 2007).

Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.

Kroning et al.; X-ray Imaging Systems for NDT and General Applications; 2002; Fraunhofer Institute for Nondestructive Testing; Saarbrucken and Dresden, Germany.

Kryski; A High Speed 4 Megapixel Digital CMOS Sensor; 2007 International Image Sensor Workshop; Jun. 6-10, 2007.

Li, "Design and Simulation of an Uncooled Double-Cantilever Microbolometer with the Potential for .about.mK NETD," 2004, Sensors and Actuators A, 351-359, vol. 112, Elsevier B.V.

Li et al., "Gettering in High Resistive Float Zone Silicon Wafers," Transaction on Nuclear Science, vol. 36(1), pp. 290-294 (Feb. 1, 1989).

Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA.

Lin, A. et al.; Optimization of Random Diffraction Gratings in Thin-Film Solar Cells Using Genetic Algorithms; 2007; 1 page; SSEL Annual Report. cited by applicant.

Low Dose Technologies; Power Point.

Madzharov, et al.; "Light trapping in thin-firm silicon solar cells for superstrate and substrate configuration" Abstract #1614, 218.sup.th ECS Meeting .COPYRGT. 2010 the Electrochemical Society.

"Masimo Rainbow SET Pulse Co-Oximetry," 2010, Masimo Corporation, Irvine, California, http://www.masimo.com/Rainbow/about.htm.

Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.

Matsuno, Shigeru et al.; Advanced Technologies for High Efficiency Photovoltaic Systems; Mitsubishi Electric Advance; vol. 122; pp. 17-19; Jun. 2008.

Meynants, et al.; "Backside illuminated global shutter COMOS image sensors"; 2011 International Image Sensor Workshop; Jun. 11, 2011.

Moloney, A.M. et al.; Novel Black Silicon PIN Photodiodes; 8 pages; Jan. 25, 2006; SPIE.

Moon et al. Selective emitter using porous silicon for crystalline silicon solar cells. Solar Energy Materials & Solar Cells, v. 93, pp. 846-850 (2009).

Moses; Nuclear Medical Imaging—Techniques and Challenges; Power Point; Feb. 9, 2005; Lawrence Berkeley National Laboratory Department of Functional Imaging.

Murkin, JM and Arangol, M, "Near Infrared spectroscopy as an index of rain and tissue oxygenation," Bri. J. of Anathesia (BJA/PGA Supplement):13-i13 (2009).

Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.

Nauka et al., Intrinsic Gettering in Oxygen-Free Silicon; App. Phys. Lett., vol. 46(7), Apr. 4, 1985.

Nauka et al., "New Intrinsic Gettering Process in Silicon Based on Interactions of Silicon Interstitials," J. App. Phys., vol. 60(2), pp. 615-621, Jul. 15, 1986.

Nayak et al, "Semiconductor Laesr Crystallization of a-Si:H," SPIE Digital Library, 2003, 277-380, vol. 4977, Bellingham, Washington. 2003.

Nayak et al, "Ultrafast-Laser-Assisted Chemical Restructuring of Silicon and Germanium Surfaces," Applied Surface Science, 2007, 6580-6583, vol. 253, Issue 15, Elsevier B.V.

Nayak et al, "Semiconductor Laser Crystallization of a-Si:H on Conducting Tin-Oxide-Coated Glass for Solar Cell and Display Applications," Applied Physics A, 2005, 1077-1080, 80, Springer Berlin, Heidelberg, Germany.

Nayak, B.K. et al.; Ultrafast Laser Textured Silicon Solar Cells; Mater. Res. Soc. Symp. Proc.; vol. 1123; 6 pages; 2009; Materials Research Society.

Nayak, et al.; "Efficient light trapping in silicon solar cells by ultrafast-laser-induced self-assembled micro/nano structures"; Progress in Photovoltaics: Research and Applications; 2011.

Oden, et al.; "Optical and Infrared Detection Using Microcantilevers;" SPIE Digital Library on Oct. 13, 2010; vol. 2744; 10 pages.

Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.

Pain, Bedabrata; "A Back-Illuminated Megapixel CMOS Image Sensor"; http://hdl.handle.net/2014/39312; May 1, 2005.

Palm et al. CIGSSe Thin Film PB Modules: From Fundamental Investigators to Advanced Performance and Stability; Thin Solid Films; 2004; pp. 544-551; vol. 451-2.

Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.

Pedraza et al., "Silicon Microcolumn Arrays Grown by Nanosecond Pulsed-Excimer Laser Irradiation", Appl. Phys. Lett., 1999, 74 (16), 2322-2324, American Institute of Physics. cited by applicant.

Pedraza et al., "Surface Nanostructuring of Silicon", Appl. Phys. A, 2003, 77, 277-284.

Rashkeev et al., "Hydrogen passivation and Activation of Oxygen Complexes in Silicon," American Institute of Physics, vol. 78(11), pp. 1571-1573 (Mar. 12, 2001).

Russell, et al.; "Nanosecond Eximer Laser Processing for Novel Microelectronic Fabrication"; Nanosecond Excimer Laser Processing; 6 pages; 1989.

Russell, Ramirez and Kelley, "Nanosecond Excimer Laser Processing for Novel Microelectronic Devices," US Navy, SPAWAR, San Diego, Techical Report, 2003.

Russell, Ramirez, Kelley, "Nanosecond Excimer Laser Processing for Novel Microelectronic Fabrication," SSC Pacific Technical Reports, pp. 228-233, 2003, vol. 4, US Navy.

Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.

(56) References Cited

OTHER PUBLICATIONS

Sanchez et al., "Whiskerlike Structure Growth on Silicon Exposed to ArF Excimer Laser Irradiation", Appl. Phys. Lett., 1996, 69 (5), 620-622.
Sanchez et al., "Dynamics of the Hydrodynamical Growth of Columns on Silicon Exposed to ArF Excimer-Laser Irradiation ", Appl. Phys. A, 66, 83-86 (1998). cited by other.
Sarnet et al.; "Femtosecond laser for black silicon and photovoltaic cells"; Feb. 21, 2008, Proc. of SPIE; vol. 6881; pags 1-15.
Senoussaoui, N. et al.; Thin-Film Solar Cells with Periodic Grating Coupler; Thin Solid Films; pp. 397-401; 2003; Elsevier B.V.
Serpenguzel et al., "Temperature Dependence of Photluminescence in Non-Crystalline Silicon", Photonics West (San Jose, CA, 2004) 454-462.
Shen et al., "Formation of Regular Arrays of Silicon Micorspikes by Femotsecond Laser Irradiation Through a Mask", Appl. Phys. Lett., 82, 1715-1717 (2003).
Solar Energy Research Institute, "Basic Photovoltaic Principles and Methods," Van Nostrand Reinhold Co., NY 1984, pp. 45-47 and 138-142.
Solhusvik, J. et al. "A 1280x960 3.75um pixel CMOS imager with Triple Exposure HDR," Proc. of 2009 International Image Sensor Workshop, Bergen, Norway, Jun. 22-28, 2009.
Stone et al.; The X-ray Sensitivity of Amorphous Selenium for Mammography;.Am. Assoc. Phys. Med.; Mar. 2002; pp. 319-324; vol. 29 No. 3; Am. Assoc. Phys. Med.
Szlufcik, J. et al.; Simple Integral Screenprinting process for selective emitter polycrystalline silicon solar cells; Applied Physics Letters; vol. 59, No. 13; Sep. 23, 1991; American Institute of Physics.
Tabbal et al., "Formation of Single Crystal Sulfur Supersaturated Silicon Based Junctions by Pulsed Laser Melting". 2007, J. Vac. Sci. Technol. B25(6), 1847-1852.
Takayanagi, et al.; "A 600.times.600 Pixel, 500, fps CMOS Image Sensor with a 4.4 jum Pinned Photodiode 5-Transistor Global Shutter Pixel"; 2007 International Image Sensor Workshop; Jun. 6-10, 2007.
Tower, John R. et al.; Large Format Backside Illuminated CCD Imager for Space Surveillance; IEEE Transactions on Electron Devices, vol. 50, No. 1; Jan. 2003; pp. 218-224.
Tull; "Femtosecond Laser Ablation of Silicon: Nanoparticles, Doping and Photovotaics"; Harvard University, Jun. 2007 (Thesis).
Uehara et al., "A High-Sensitive Digital Photosensor Using MOS Interface-Trap Charge Pumping," IEICE Electronics Express, 2004, vol. 1, No. 18, 556-561.
Wilson, "Depth Distributions of Sulfur Implanted Into Silicon as a Function of Ion energy, Ion Fluence, and Anneal Temperature," 1984, Appl. Phys. 55(10, 3490-3494.
Winderbaum, S. et al.; Reactive ion etching (RIE) as a method for texturing polycrystalline silicon solar cells; Solar Energy Materials and Solar Cells; 1997; pp. 239-248; Elsevier Science B.V.
Wu et al., "Black Silicon" Harvard UPS 1999.
Wu et al., "Black Silicon: A New Light Absorber," APS Centennial Meeting (Mar. 23, 1999).
Wu et al., "Femtosecond laser-gas-solid interactions," Thesis presented to the Department of Physics at Harvard University, pp. 1-113, 126-136, Aug. 2000.
Wu et al., "Visible Luminescence From Silicon Surfaces Microstructured in Air". Appl. Phys. Lett., vol. 81, No. 11, 1999-2001 (2002).
Wu, et al "Near-Unity Below-Band-Gap Absorption by Microstructured Silicon," 2001, Applied Physics Letters, 1850-1852, vol. 78, No. 13, American Institute of Physics.
Xu, Y., et al, "Infrared Detection Using Thermally Isolated Diode," Sensors and Actuators A, Elsevier Sequoia S.A., 1993, vol. 36, 209-217, Lausanne, Switzerland.
Yablonovitch, et al.; "Intensity Enhancement in Textured Optical Sheets for Solar Cells"; .COPYRGT. 1982 IEEE.
Yamamoto, K. et al.; NIR Sensitivity Enhancement by Laser Treatment for Si Detectors; Nuclear Instruments and Methods in Physics Research A; pp. 520-523; Mar. 31, 2010; Elsevier.
Yan, B.; Light Trapping Effect from Randomized Textures of Ag/ZnO Back Reflector on Hyrdrogenated Amorphous and Nanocrystalline Silicon Based Solar Cells; Thin Film Solar Technology II; vol. 7771; 2010; SPIE.
Yasutomi, et al.; "Two-Stage Charge Transfer Pixel Using Pinned Diodes for Low-Noise Global Shutter Imaging"; 2009 International Image Sensor Workshop; Mar. 28, 2009.
Younkin et al., "Infrared Absorption by Conical Silicon Microstructures Made in a Variety of Background Gases Using Femtosecond-Laser Pulses", J. Appl. Phys., 93, 2626-2629 (2003).
Younkin, "Surface Studies and Microstructure Fabrication Using Femtosecond Laser Pulses," Thesis presented to the Division of Engineering & Applied sciences at Harvard University (Aug. 2001).
Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.
Zaidi, S.H. et al.; Diffraction Grating Structures in Solar Cells; Photovoltaic Specialists Conference, 2000; 4 pages; Sep. 2000; IEEE.
Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.
Zhu et al., "Evolution of Silicon Surface Microstructures by Picosecond and Femtosecond Laser Irradiations," Applied Surface Science, 2005, 102-108, Elsevie, Amsterdam, NL.Ultra-Shallow P+-Junction Formation in Silicon by Excimer Laser Doping: a Heat and Mass Transfer Perspective, Int. J. Heat Mass Transfer, 1996, 3835-3844, vol. 39, No. 18, Elsevier Science Ltd., Great Britain.
Bernhard, C.G., "Structural and Functional Adaptation in a Visual System" Endevor vol. 26, pp. 79-84, May 1967.
Clapham, P.B. et al, "Reduction of Lens Reflexion by the Moth Eye Principle" Nature, vol. 244. Aug. 1973, pp. 281-282.
Huang, et al.; "Key Technique for texturing a uniform pyramid structure with a layer of silicon nitride on monocrystalline silicon wafer" Applied Surface Science; 2013 pp. 245-249.
Jansen, H. et al., "The Black Silicon Method: a universal method for determining the parameter setting of a flourine-based reactive ion etcher in deep silicon trench etching with profile control",J. Micromech. Microeng. vol. 5, 1995 pp. 115-120.
Koh et al., "Simple nanostructuring on silicon surfaceby means of focused beam patterning and wet etching", Applied Surface Science, 2000 pp. 599-603.
Myers, Richard et al., "Enhancing Near-Ir Avalanche Photodiodes Performance by Femtosecond Laser Microstructuring" Harvard Dept. of Physics.
Zhong, S. et al. "Excellent Light Trapping in Ultrathin Solar Cells," AFM-Journal, May 2016 pp. 1-11.
Ziou et al., Depth from defocus using the hermite transform, Image Processing, 1998. ICIP 98. Intl. Conference on Chicago, IL. Oct. 1998 pp. 958-962.

* cited by examiner

SHALLOW TRENCH TEXTURED REGIONS AND ASSOCIATED METHODS

PRIORITY DATA

This is a continuation of U.S. patent application Ser. No. 14/084,392, filed Nov. 19, 2013, which claims the benefit of U.S. Provisional Patent Application Ser. No. 61/841,326, filed on Jun. 29, 2013, each of which are incorporated herein by reference in their entirety.

BACKGROUND

The interaction of light with semiconductor materials has been a significant innovation. Silicon imaging devices are used in various technologies, such as digital cameras, optical mice, video cameras, cell phones, and the like. Charge-coupled devices (CCDs) were widely used in digital imaging, and were later improved upon by complementary metal-oxide-semiconductor (CMOS) imagers having improved performance. Many traditional CMOS imagers utilize front side illumination (FSI). In such cases, electromagnetic radiation is incident upon the semiconductor surface containing the CMOS devices and circuits. Backside illumination (BSI) CMOS imagers have also been used, and in many designs electromagnetic radiation is incident on the semiconductor surface opposite the CMOS devices and circuits. CMOS sensors are typically manufactured from silicon and can covert visible incident light into a photocurrent and ultimately into a digital image. Silicon-based technologies for detecting infrared incident electromagnetic radiation have been problematic, however, because silicon is an indirect bandgap semiconductor having a bandgap of about 1.1 eV. Thus the absorption of electromagnetic radiation having wavelengths of greater than about 1100 nm is, therefore, very low in silicon.

SUMMARY

The present disclosure provides optoelectronic devices having enhanced light absorption characteristics, including systems incorporating such devices and various associated methods. In one aspect, for example, an optoelectronic device having enhanced absorption of electromagnetic radiation is provided. Such a device can include a semiconductor layer coupled to a support substrate and an array of shallow trench isolation surface features positioned between the semiconductor layer and the support substrate, the surface features positioned to interact with electromagnetic radiation that passes through the semiconductor layer. In one aspect, the semiconductor layer is single crystal silicon. In another aspect, a device layer can be coupled to the semiconductor layer on a side opposite the surface features.

In one aspect, a first bonding layer can be coupled between the semiconductor layer and the support substrate. While various configurations are contemplated, in one specific aspect first bonding layer can be coupled between the support substrate and the surface features. In another aspect, a second bonding layer can be positioned between the first bonding layer and the support substrate. In yet another aspect, a reflector layer can be disposed between the first bonding layer and the second bonding layer.

The surface features can have a variety of configurations and can be formed in a variety of locations between the semiconductor layer and the semiconductor support. For example, in one aspect the surface features can be formed in the support substrate. In another aspect, the surface features can be formed in the semiconductor layer. Furthermore, in one aspect the surface features can be arranged according to a predetermined pattern. In one specific aspect, such a predetermined pattern can be an at least substantially uniform grid. In specific aspect, such a predetermined pattern can be a non-uniform arrangement. Additionally, in one aspect the surface features can have an at least substantially uniform height. In another aspect, the surface features are not uniform in height.

Additionally, a variety of architectural configurations are contemplated. For example, in one aspect the device can be architecturally configured as a front-side illuminated optoelectronic device. In another aspect, the device can be architecturally configured as a back-side illuminated optoelectronic device.

In another aspect, a method of making an optoelectronic device is provided. Such a method can include creating an array of surface features using shallow trench isolation etching and bonding the array of surface features between a support substrate and a semiconductor layer. In another aspect, creating the array of surface features can further include creating the array of surface features on at least a portion of a surface of the semiconductor layer. In yet another aspect, creating the array of surface features further includes creating the array of surface features on at least a portion of a surface of the support substrate. Furthermore, in one aspect bonding the array of surface features between the support substrate and the semiconductor layer can further include depositing a first bonding layer onto the semiconductor layer and bonding the first bonding layer to a second bonding layer disposed on the support substrate. In some aspects a reflector can be deposited on at least one of the first bonding layer or the second bonding layer prior to bonding the semiconductor layer to the support substrate. In a further aspect the method can include thinning the semiconductor layer at a surface opposite the support substrate to a thickness of from about 1 microns to about 10 microns to create a pristine thinned surface and forming a device layer on the thinned surface. The semiconductor can then be further processed as desired to form the optoelectronic device.

BRIEF DESCRIPTION OF THE DRAWINGS

For a further understanding of the nature and advantage of the present disclosure, reference is being made to the following detailed description of embodiments and in connection with the accompanying drawings, in which.

DETAILED DESCRIPTION

Figure 1:
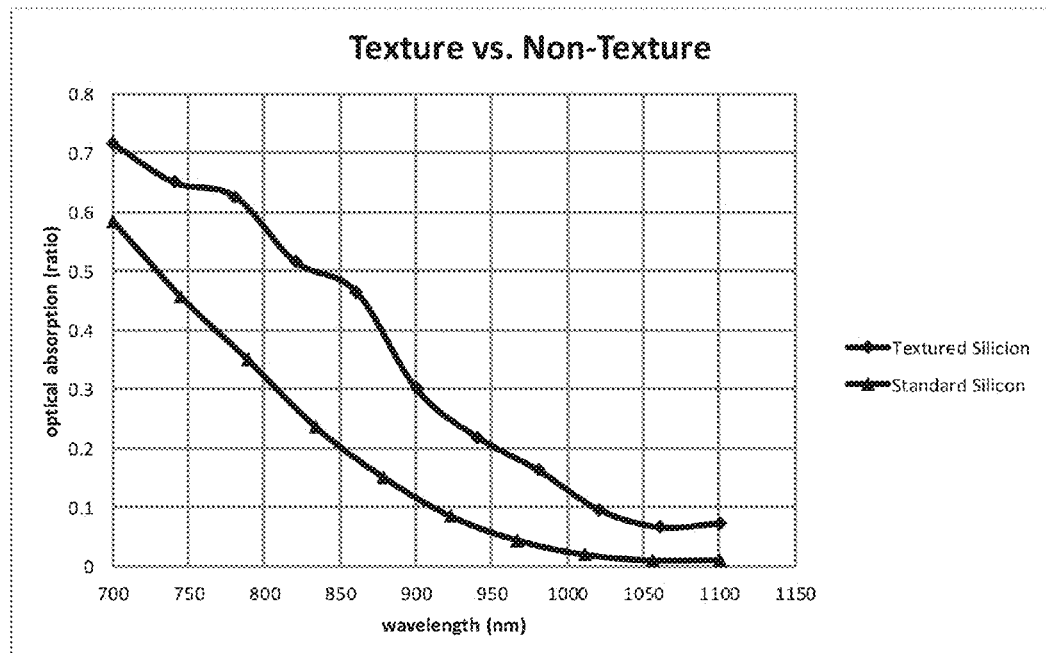
FIG. 1 provides data showing the optical absorption of textured silicon compared to standard silicon as a function of wavelength in accordance with an embodiment of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

DEFINITIONS

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, the terms "light" and "electromagnetic radiation" can be used interchangeably and can refer to electromagnetic radiation in the ultraviolet, visible, near infrared and infrared spectra. The terms can further more broadly include electromagnetic radiation such as radio waves, microwaves, x-rays, and gamma rays. Thus, the term "light" is not limited to electromagnetic radiation in the visible spectrum. Many examples of light described herein refer specifically to electromagnetic radiation in the visible and infrared (and/or near infrared) spectra. For purposes of this disclosure, visible range wavelengths are considered to be from approximately 350 nm to 800 nm and non-visible wavelengths are considered to be longer than about 800 nm or shorter than about 350 nm. Furthermore, the infrared spectrum is considered to include a near infrared portion of the spectrum including wavelengths of approximately 800 to 1100 nm, a short wave infrared portion of the spectrum including wavelengths of approximately 1100 nm to 3 micrometers, and a mid-to-long wavelength infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

As used herein, the term "detection" refers to the sensing, absorption, and/or collection of electromagnetic radiation.

As used herein, the term "backside illumination" refers to a device architecture design whereby electromagnetic radiation is incident on a surface of a semiconductor material that is opposite a surface containing the device circuitry. In other words, electromagnetic radiation is incident upon and passes through a semiconductor material prior to contacting the device circuitry.

As used herein, the term "frontside illumination" refers to a device architecture design whereby electromagnetic radiation is incident on a surface of a semiconductor material that contains the device circuitry. In other words, electromagnetic radiation is incident upon and passes through the device circuitry region prior to contacting the semiconductor material.

As used herein, the term "absorptance" refers to the fraction of incident electromagnetic radiation absorbed by a material or device.

As used herein, the terms "textured layer" and "textured surface" can be used interchangeably, and refer to a surface having a topology with nano- to micron-sized surface variations. Such a surface topology can be formed by a variety of known STI techniques. It is noted that laser ablation techniques, at least in one aspect, are specifically disclaimed. While the characteristics of such a surface can be variable depending on the materials and techniques employed, in one aspect such a surface can include micron-sized structures (e.g. about 1 μm to about 10 μm). In yet another aspect, the surface can include nano-sized and/or micron-sized structures from about 5 nm and about 10 μm. In another aspect, surface structures can be from about 100 nm to about 1 micron. A variety of criteria can be utilized to measure the size of such structures. For example, for cone-like structures the above ranges are intended to be measured from the peak of a structure to the valley formed between that structure and an adjacent neighboring structure. For structures such as nanopores, the above ranges are intended to be approximate diameters. Additionally, the surface structures can be spaced at various average distances from one another. In one aspect, neighboring structures can be spaced at a distance of from about 50 nm to about 2 μm. Such spacing is intended to be from a center point of one structure to the center point of a neighboring structure.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

THE DISCLOSURE

Traditional silicon photodetecting imagers have limited light absorption/detection properties. For example, such silicon based detectors can be mostly transparent to infrared light, particularly with thin silicon layers. In some cases, other materials such as InGaAs can be used to detect infrared light having wavelengths greater than about 1000 nm, silicon is still commonly used to detect wavelengths in the visible spectrum (i.e. visible light, 350 nm-800 nm). Traditional silicon materials require substantial optical path lengths to detect photons from electromagnetic radiation having wavelengths longer than approximately 700 nm. As a result, visible light can be absorbed at relatively shallow depths in silicon, and absorption of longer wavelengths (e.g. 900 nm) in silicon of a standard wafer depth (e.g. approximately 750 µm) is poor. Increasing the thicknesses of the silicon layer to allow longer wavelength absorption thus greatly increases the thicknesses of the photodetecting imager.

The optoelectronic devices according to aspects of the present disclosure exhibit increased light absorption due to an increase in the effective optical path length for longer wavelengths of light as compared to traditional devices. The absorption depth in conventional silicon detectors is the depth into silicon at which the radiation intensity is reduced to about 36% of the value at the surface of the semiconductor. The increased optical path length of photons with the present silicon materials results in an apparent reduction in the absorption depth, or a reduced apparent or effective absorption depth. For example, the effective absorption depth of silicon can be reduced such that these longer wavelengths can be absorbed in silicon layers that are less than 850 microns thick. In other words, by increasing the optical path length, these devices are able to absorb longer wavelengths (e.g. >1000 nm for silicon) within a thinner silicon material. In addition to absorbing light having longer wavelengths in thin silicon materials (e.g. less than 30 microns thick as compared to 700 microns thick), the response rate or response speed can also be increased by using such thin materials.

The optoelectronic devices of the present disclosure can be front side illumination (FSI) or back side illumination (BSI) devices. In a typical FSI imager, incident light enters the semiconductor device by first passing by transistors and metal circuitry. The light, however, can scatter off of the transistors and circuitry prior to entering the light sensing portion of the imager, thus causing optical loss and noise. A lens can thus be disposed on the topside of a FSI pixel to direct and focus the incident light to the light sensing active region of the device, thus at least partially avoiding the circuitry. A variety of lenses and lens configurations are contemplated, however in one aspect the lens can be a micro-lens.

BSI imagers, one the other hand, are configured such that incident light enters the device via the light sensitive region opposite the circuitry and is mostly absorbed prior to reaching the circuitry, thus greatly reducing scattering and/or noise. BSI designs also allow for greater sensitivity, smaller pixel architecture, and a high fill factor for the imager. Additionally, it should also be understood that devices according to aspects of the present disclosure, whether they be FSI or BSI, can be incorporated into complimentary metal-oxide-semiconductor (CMOS) imager architectures or charge-coupled device (CCD) imager architectures.

Generally, and without limitation, the present disclosure provides a variety of optoelectronic devices, such as, broadband photosensitive diodes, pixels, and imagers capable of detecting visible as well as infrared electromagnetic radiation, including associated methods of making such devices. In one specific aspect, for example, an optoelectronic device is provided having enhanced absorption of electromagnetic radiation. Such a device can include a semiconductor layer coupled to a support substrate and an array of shallow trench isolation surface features positioned between the semiconductor layer and the support substrate, the surface features positioned to interact with electromagnetic radiation that passes through the semiconductor layer.

It has thus been discovered that such an array of shallow trench isolation surface features positioned in an architecturally appropriate manner can greatly increase the optical absorption of silicon materials. As is shown in FIG. 1, for example, such a textured region can increase the optical absorption of silicon as compared to non-textured silicon over an electromagnetic spectrum range of at least about 700 nm to about 1100 nm.

Figure 2:
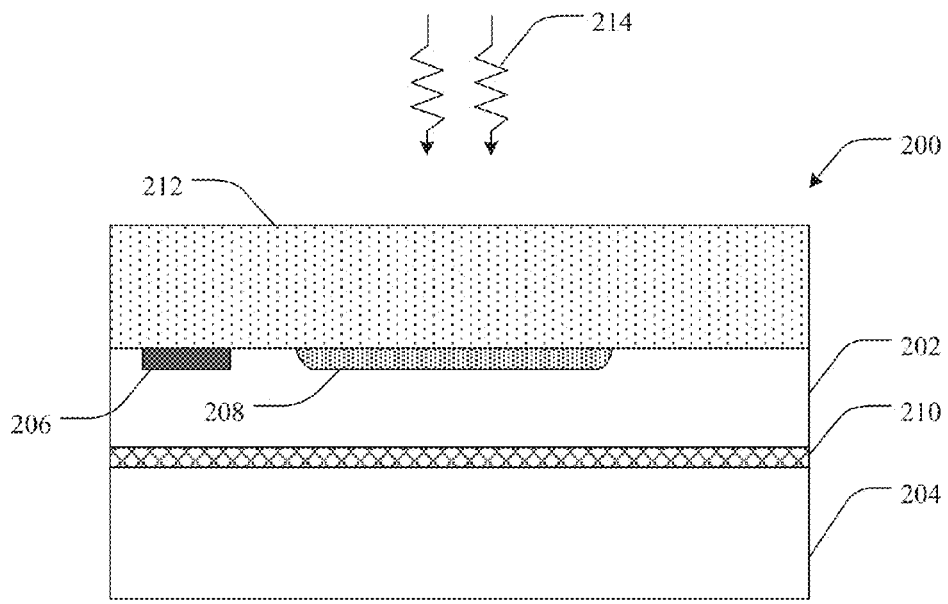
FIG. 2 is a cross-sectional view of an image sensor in accordance with another embodiment of the present disclosure.

As can be seen in FIG. 2, for example, a FSI device is shown 200 having a semiconductor layer 202 coupled to a support substrate 204, where the semiconductor layer can include one or more doped regions 206, 208, that form at least one junction. A textured layer 210 including an array or plurality of STI surface features is positioned between the semiconductor layer 202 and the support substrate 204. A circuitry layer 212 is coupled to the semiconductor layer 202 on a side opposite the support substrate 204. Light 214 is shown impinging on the device 200 and passing through the circuitry layer 212 prior to contacting the semiconductor layer 202. Light 214 that is not absorbed by and subsequently passes through the semiconductor layer 202 contacts the textured layer 210 and is redirected back into the semiconductor layer 202, thus allowing light to be absorbed in a subsequent pass. As such, the textured layer 210 increases the effective optical path length of the light 214 as it passes through the device. In one aspect, the semiconductor layer can be single crystal silicon.

Figure 3:
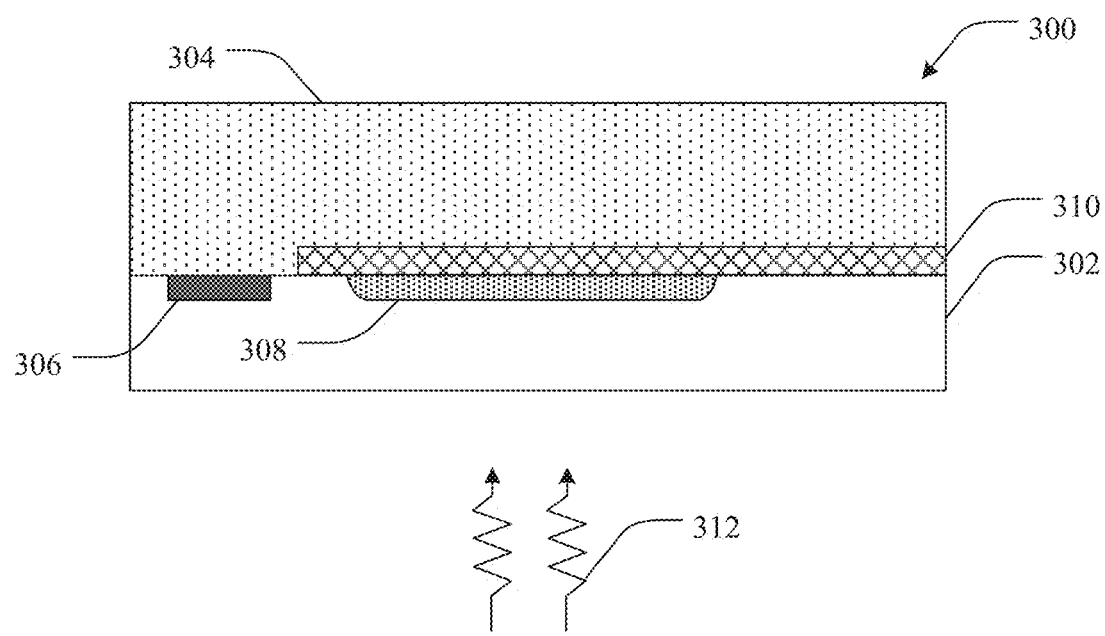
FIG. 3 is a cross-sectional view of an image sensor in accordance with another embodiment of the present disclosure.

Turning to FIG. 3, a BSI device is shown 300 having a semiconductor layer 302 coupled to a support substrate 304, where the semiconductor layer can include one or more doped regions 306, 308, that form at least one junction. In this case the support substrate 304 can be a circuitry layer or a bulk substrate including a circuitry layer. A textured layer 310 including an array or plurality of surface features is positioned between the semiconductor layer 302 and the support substrate 304. Light 312 is shown impinging on the device 300 and passing through the semiconductor layer 302 without contacting any circuit elements that may be positioned in or at the support substrate 304. Light 312 that is not absorbed by and subsequently passes through the semiconductor layer 302 contacts the textured layer 310 and is redirected back into the semiconductor layer 302. As with the FSI device shown in FIG. 2, the textured layer 310 increases the effective optical path length of the light 312 as it passed through the device. In one aspect, the semiconductor layer can be single crystal silicon.

The multiple doped regions for both the FSI and the BSI case can have the same doping profile or different doping profiles, depending on the device. Furthermore, any number or configuration of doped regions is considered to be within the present scope. In some aspects the semiconductor layer can be doped, and thus can be considered to be a doped region.

Additionally, the device can include deep trench isolation (DTI) to isolate the imager and to provide light trapping functionality. In some aspects such a device can include a silicon handle wafer in addition to the support substrate to facilitate manipulation of the device. In some aspects, the support substrate can be a silicon handle wafer. One technique for coupling a silicon handle wafer to the semiconductor layer includes oxide bonding. Further details regarding substrates, bonding, and various imager details can be found in U.S. patent application Ser. No. 13/069,135, which is incorporated herein by reference.

Optoelectronic devices according to aspects of the present disclosure can include photodiodes or pixels that are capable of absorbing electromagnetic radiation within a given wavelength range. Such imagers can be passive pixel sensors (PPS), active pixel sensors (APS), digital pixel sensor imagers (DPS), or the like. Such devices can also be architecturally configured as a three or four transistor active pixel sensor (3T APS or 4T APS). Additionally, devices having greater than 4 transistors are also within the present scope. Such devices can also include pinned photodiode architectures as used in CMOS imagers. Also, such optoelectronic devices can be used in time-of-flight (TOF) applications, as well as various structured light applications. It is also contemplated that such devices can also be configured as rolling shutter or global shutter readout devices.

In some aspects, a device can include a passivation layer positioned between the textured layer and the doped regions. In some aspects, the passivation layer can be doped to create a surface field, as is described more fully below. It is noted, that with or without the passivation region, the textured region can be located on the light incident side of the semiconductor material, on a side of the semiconductor material opposite the light incident side, or both on the light incident side and opposite the light incident side. Additionally, the device can also include an electrical transfer element coupled to the semiconductor layer and operable to transfer an electrical signal from the doped regions. Additionally, an electrical transfer element can include a variety of devices, including without limitation, transistors, sensing nodes, transfer gates, transfer electrodes, and the like.

As has been described, the textured layer is comprised of a plurality of surface features, where such surface features have been formed in an array or other grouping across an interface between the semiconductor layer and the support substrate. In some aspects, the textured region can cover the entire interface between the semiconductor layer and the support substrate, while in other aspects the textured region may cover only a portion of the interface between the semiconductor layer and the support substrate. For example, in one aspect the textured layer can cover the interface between the materials at least in regions where light passing through the semiconductor layer would contact the interface. In another aspect, the textured layer can cover the interface between the materials only in regions where light passing through the semiconductor layer would contact the interface. As such, it should be understood that the coverage area of the textured layer can be dependent on the design of the device, as well as the intended pattern of light trapping and/or light redirection that is desired. It is thus intended that the scope of the present disclosure not necessarily be limited by the degree to which the interface includes textured layer.

Furthermore, in some aspects one or more intervening layers can be present between the semiconductor layer and the support substrate. Such layers can be used to facilitate bonding, for reflecting light, for a variety of other purposes. In one aspect, for example, one or more bonding layers can be utilized to facilitate bonding the support substrate to the semiconductor layer. In such cases, it can be beneficial to apply a first bonding layer to the semiconductor layer and a second bonding layer to the support substrate as a bonding mechanism. The bonding layer can include a material capable of facilitating bonding between the support substrate and the semiconductor layer. Non-limiting examples can include silicon oxides, silicon nitrides, amorphous silicons, and the like. The thickness of a given bonding layer can additionally vary depending on the manufacturing techniques utilized and preferences of the designer. In one aspect, however, a bonding layer can be thick enough to facilitate bonding and thin enough to minimize waveguide effects within the device. In another aspect, a bonding layer can have a thickness of from about 30 nm to about 3 microns. In yet another aspect, a bonding layer can have a thickness of from about 40 nm to about 2 microns.

The position of the textured layer can thus be affected by the nature of the coupling of the support substrate and the semiconductor layer as well as the location where the textured layer is formed. In one aspect, the textured layer can be formed in or on the semiconductor layer. In another aspect, the textured layer can be formed in or on the support substrate. For the situation where the textured layer is formed in or on the semiconductor layer, one or more bonding layers can be coupled between the support substrate and the textured layer. If two or more bonding layers are utilized, a first bonding layer can be formed on the textured layer, a second bonding layer can be formed on the support substrate, and the first and second bonding layers can then be bonded together.

For the situation where the textured layer is formed in or on the support substrate, one or more bonding layers can be coupled between semiconductor layer and the textured layer. For example, in one aspect one or more bonding layer can be coupled between the support substrate and the surface features. If two or more bonding layers are utilized, a first bonding layer can be formed on the textured layer, a second bonding layer can be formed on the semiconductor layer, and the first and second bonding layers can then be bonded together.

As has been described, a light reflector layer can additionally be disposed between any two of the above referenced layers or materials. For example, in one aspect a reflector layer can be applied to one side of the textured layer. In another aspect, a reflector layer can be applied to either side of a bonding layer. In one specific aspect, a reflector layer can be positioned between a first and second bonding layer. The reflector layer can include any material capable of reflecting light back into the semiconductor layer. Non-limiting examples can include metals, ceramics, oxides, glass, distributed Bragg reflector stacks, and the like, including alloys and combinations thereof.

The surface features of the textured layer can be made by any process capable of etching in a repeatable and predictable manner. In one aspect, however, the surface features can be formed by any number of shallow trench isolation (STI) techniques. While such manufacturing techniques are known, they have previously been utilized for creating regions of electrical isolation between circuit elements.

Thus, such implementations have been utilized around the peripheries of circuit elements. The present scope, however, is directed to creating arrays of surface features in locations to interact with light. Through this interaction, light can be redirected, diffused, focused, or otherwise manipulated by the surface feature array.

Additionally, STI techniques can be used to form such surface features having a variety of shapes, patterns, and the like. In one aspect, for example, the surface features can be arranged into an array according to a predetermined pattern. In one specific aspect, such a predetermined pattern can be a uniform or substantially uniform grid. Additionally, a predetermined pattern can be an organized, an ordered, or a periodic pattern. In another aspect, the predetermined pattern can be a non-uniform or a substantially non-uniform pattern. Surface feature array patterns can also be disordered, quasi-periodic, random, or the like.

As has been described, the textured layer can function to diffuse light, to redirect light, and to thus increase the quantum efficiency of the device. In some cases, a portion of the light passes through the semiconductor layer to contact the textured layer. The surface features of the textured layer thus facilitate an increase the effective optical path length of the semiconductor layer. Such surface features can be micron-sized and/or nano-sized, and can be any shape or configuration that can be formed via a STI technique. Non-limiting examples of such shapes and configurations include cones, pillars, pyramids, inverted features, trenches, gratings, protrusions, and the like, including combinations thereof. Additionally, factors such as manipulating the feature sizes, dimensions, material type, dopant profiles, texture location, etc. can allow tuning of the textured layer for a specific wavelength or range of wavelengths. In one aspect, tuning the device can allow specific wavelengths or ranges of wavelengths to be absorbed. In another aspect, tuning the device can allow specific wavelengths or ranges of wavelengths to be reduced or eliminated via filtering.

Textured layers according to aspects of the present disclosure can allow a semiconductor layer to experience multiple passes of light within the device, particularly at longer wavelengths (i.e. infrared). Such internal reflection can increases the effective optical path length, thus allowing a material such as silicon to absorb light at thicknesses that are less than standard silicon. As has been described, this increase in the effective optical path length of electromagnetic radiation in silicon increases the quantum efficiency of the device, thus leading to an improved signal to noise ratio.

The materials used for making the textured layer can vary depending on the design and the desired characteristics of the device. As such, any material that can be utilized in the construction of a textured region is considered to be within the present scope. In one aspect, the textured region can be formed directly on the semiconductor layer (e.g. a silicon epi-layer). In another aspect, an additional material can be deposited onto the semiconductor layer to support the formation of the textured layer. Non-limiting to examples of such materials include semiconductor materials, dielectric materials, silicon, polysilicon, amorphous silicon, transparent conductive oxides, and the like, including composites and combinations thereof. In one specific aspect, the textured layer can be a textured polysilicon layer. Thus a polysilicon layer can be deposited onto the semiconductor layer, either directly or onto an intermediate passivation layer, and then textured to form the textured region. In another aspect, the textured layer can be a textured dielectric layer. In this case the textured layer can be a portion of a dielectric layer making up a passivation region disposed on the semiconductor layer. In yet another aspect the textured layer can be a transparent conductive oxide or another semiconductor material. In the case of dielectric layers, the textured layer can be a textured portion of a passivation layer or the textured layer can be formed from other dielectric material deposited over a passivation layer.

Various methods can be utilized to form STI features, and any such shallow trench formation technique is considered to be within the present scope. It is noted that, in one aspect, texturing techniques that involve laser ablation are specifically disclaimed from the present scope.

In some cases, the textured layer can be formed by using a patterned mask and photolithography, followed by etching to define a specific structure or pattern. In one aspect, STI techniques can be used to form the textured region. Various STI techniques are contemplated, and any such technique is considered to be within the present scope. In one non-limiting example, an oxide material is deposited on the material to be etched with shallow trenches. A uniform coating of a nitride material is deposited on the oxide material followed by a patterned coating of a resist material to be used as a mask. Thus the pattern of the mask will define the future pattern of the textured region. Any of a number of etch processes can then be applied across the layered material. As a result, regions of the layered material beneath the resist are protected from the etch, while regions of the layered material that are not located beneath the resist are etched by the process. This process is continued to produce a shallow trench (or a hole) etched in the unprotected regions between the resist material through the nitride material, the oxide material, and into the substrate. Following etching of the shallow trench, the resist material can be removed by any appropriate process. It is noted that, while the term "shallow trench" is used to describe the etching process, the resulting etch pattern is not limited to trenches, but also includes holes, pits, cones, and the like.

In some aspects, the etched regions can be left as open spaces. In other aspects, further processing can be performed to fill in the etched regions. For example, an oxide material can be deposited along the sides and bottom of the trenches similar to an oxide liner. Such can be deposited by a thermal oxide process, a direct oxide deposition, or any other useful process. Once the etched regions are sufficiently filled, the resulting surface can be further processed by techniques such as CMP processing, and then, once exposed, the nitride layer can be removed.

In another aspect, the etched regions can be highly doped along sidewalls and/or bottoms with a dopant profile to create a surface field. A back surface field can function to impede the movement of photo-generated carriers from the junction toward the textured layer, and as such the dopant profile should be designed accordingly. The use of the back surface field in the etched regions can thus be used to electrically passivate the regions around the textured layer.

Figure 4:
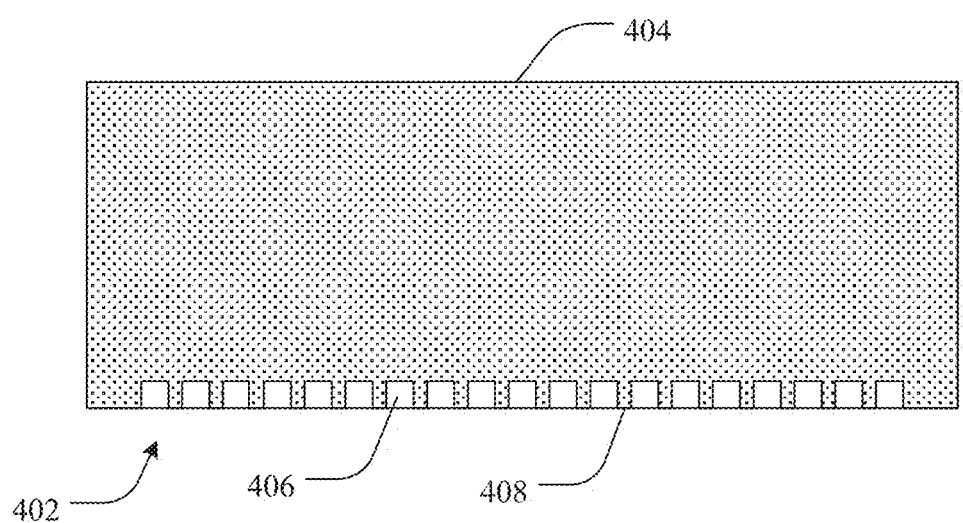
FIG. 4 is a cross-sectional view of a textured layer associated with a substrate in accordance with another embodiment of the present disclosure.

The surface features can have a variety of configurations, structures, and sizes, depending on the desired characteristics of the resulting device. In one aspect, as is shown in FIG. 4 for example, surface features 402 are shown formed in a material layer 404, such as, for example, the semiconductor layer. The surface features in this case are arranged uniformly as a uniform grid pattern comprised of a series of spaces or holes 406 and lines 408 or pillars. Various uniform grid patterns are contemplated, and in one aspect the pattern can include a uniformly spaced series pillars surrounded by spaces, or vice versa depending on whether the pattern is viewed from the topside or the bottom side of the etched material. In another aspect, the uniform grid pattern can include a series of lines surrounding a uniformly spaced series of spaces or holes cut between the lines, or vice versa.

Figure 5:
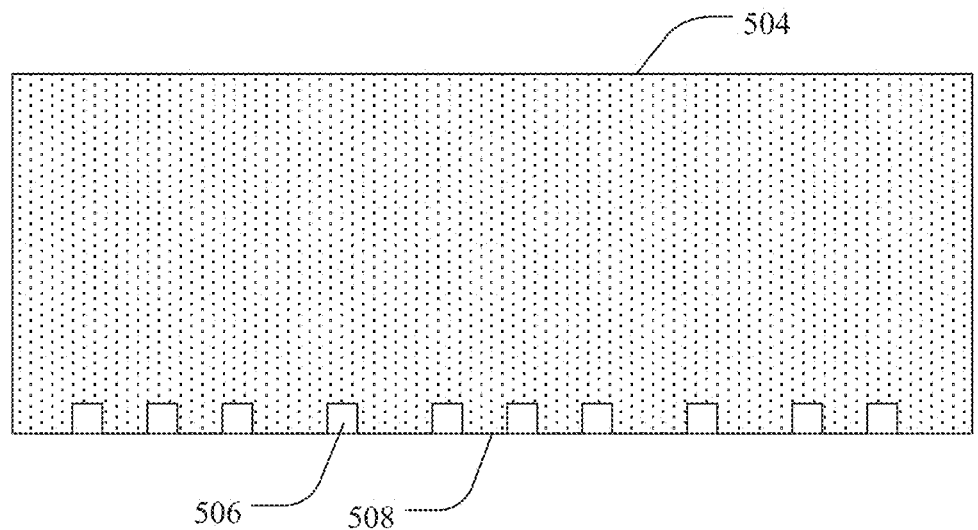
FIG. 5 is a cross-sectional view of a textured layer associated with the substrate in accordance with another embodiment of the present disclosure.
Figure 6:
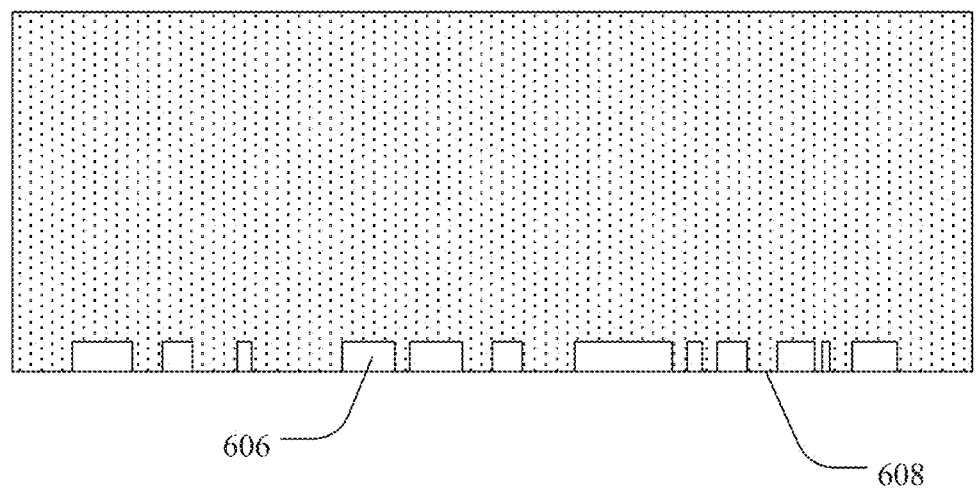
FIG. 6 is a cross-sectional view of a textured region associated with the substrate in accordance with another embodiment of the present layer.

Additionally, as has been described, the etch pattern of surface features can be a predetermined nonuniform pattern. As is shown in FIG. 5, for example, the spaces 506 etched into the material layer 504 are of approximately the same size and shape and the lines or pillars 508 vary in width. FIG. 6 shows an etch pattern were both the spaces 606 and the lines or pillars 608 are varied. It should be noted that a variety of etch patterns are contemplated, and that the present scope should not be limited thereby. With respect to nonuniform patterns, in some aspects the patterns can be random, either for the line or pillar, the spaces, or both.

In addition to the pattern formed by the STI process, the depth of the etch can also have an impact on optical absorption. In one aspect, for example, the surface features can have a uniform or substantially uniform depth or height. While the depth or height can vary depending on the intended use and design of the device, in one aspect the height or depth can be from about 50 nm to about 2 microns. It is noted that, in standard STI processes, the processing depth is about 0.35 microns, which is also considered to be within the present scope. In another aspect, the surface features can have a non-uniform depth or height, and thus can vary across the surface of the textured layer. Such variation in depth can be random in some cases, and nonrandom in other cases depending on the desired design of the device. In one aspect, the depth or height can be from about 50 nm to about 2 microns. In some aspects discrete levels of depths can be utilized. For example, in one aspect one level may have a depth of 0.35 microns, while another level may have a depth of 0.7 microns. By using different masks, different depth levels can be achieved. Similarly, subsequent levels can be etched to create a third level, a fourth level, or more. It is noted that in some aspects each level can have a depth of from about 50 nm to about 2 microns.

As has been described, the various devices according to aspects of the present disclosure can exhibit increased absorption as compared to traditional photosensitive devices. For example, for an active semiconductor layer according to aspects of the present disclosure that has a thickness of from about 1 micron to about 10 microns, the absorption characteristics can be as follows: in one aspect the semiconductor layer can absorb from about 60% to about 80% of incident 700 nm light; in another aspect, the semiconductor layer can absorb from about 40% to about 60% of incident 850 nm light; in yet another aspect, the semiconductor layer can absorb from about 25% to about 40% of incident 940 nm light; in a further aspect, the semiconductor layer can absorb from about 15% to about 30% of incident 1000 nm light; and in yet a further aspect, the semiconductor layer can absorb from about 5% to about 10% of incident 1064 nm light. Furthermore, depending on the architecture, devices according to aspects of the present disclosure can exhibit external quantum efficiencies (EQE) that are from about 1% to about 5% less than the above described absorption values for a given wavelength of light. Additionally, it is further noted that the devices of the present disclosure have at least substantially the same dark current as a standard EPI device with no textured region.

While the present disclosure has focused on silicon materials, it should be understood that a variety of semiconductor materials are also contemplated for use and should be considered to be within the present scope. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof. In yet another aspect, the semiconductor materials can include any material that is useful for making imagers, including, Si, SiGe, InGaAs, and the like, including combinations thereof.

A silicon semiconductor layer can be of any thickness that allows electromagnetic radiation detection and conversion functionality, and thus any such thickness of silicon material is considered to be within the present scope. In some aspects the textured layer increases the efficiency of the device such that the silicon material can be thinner than has previously been possible. Decreasing the thickness of the silicon material reduces the amount of silicon required to make such a device. In one aspect, for example, the silicon material has a thickness of from about 500 nm to about 50 µm. In another aspect, the silicon material has a thickness of less than or equal to about 100 µm. In yet another aspect, the silicon material has a thickness of from about 1 µm to about 10 µm. In a further aspect, the silicon material can have a thickness of from about 5 µm to about 50 µm. In yet a further aspect, the silicon material can have a thickness of from about 5 µm to about 10 µm.

A variety of dopant materials are contemplated for both the formation of the multiple doped regions and to create a surface field at the shallow trench regions, and any such dopant that can be used in such processes is considered to be within the present scope. It should be noted that the particular dopant utilized can vary depending on the material being doped, as well as the intended use of the resulting material.

A dopant can be either charge donating or accepting dopant species. More specifically, an electron donating or a hole donating species can cause a region to become more positive or negative in polarity as compared to the semiconductor layer. In one aspect, for example, the doped region can be p-doped. In another aspect the doped region can be n-doped. A highly doped region can also be formed on or near the doped region to create a pinned diode. In one non-limiting example, the semiconductor layer can be negative in polarity, and a doped region and a highly doped region can be doped with p+ and n dopants respectively. In some aspects, variations of n(−−), n(−), n(+), n(++), p(−−), p(−), p(+), or p(++) type doping of the regions can be used. In one aspect, non-limiting examples of dopant materials can include S, F, B, P, N, As, Se, Te, Ge, Ar, Ga, In, Sb, and combinations thereof.

What is claimed is:

1. An optoelectronic device having enhanced absorption of electromagnetic radiation, comprising:
   a semiconductor layer coupled to a support substrate;
   a first bonding layer coupled between the semiconductor layer and the support substrate;
   a second bonding layer positioned between the first bonding layer and the support substrate;

a reflector layer disposed between the first bonding layer and the second bonding layer; and an array of shallow trench isolation surface features positioned between the semiconductor layer and the support substrate, the surface features positioned to interact with electromagnetic radiation that passes through the semiconductor layer, wherein the surface features are formed in the semiconductor layer.

2. The device of claim 1, wherein the semiconductor layer is single crystal silicon.

3. The device of claim 1, wherein the first bonding layer is coupled between the support substrate and the surface features.

4. The device of claim 1, wherein the surface features have an at least substantially uniform height.

5. The device of claim 1, wherein the surface features are not uniform in height.

6. The device of claim 1, further comprising a device layer coupled to the semiconductor layer on a side opposite the surface features.

7. The device of claim 1, wherein the device is architecturally configured as a front-side illuminated optoelectronic device.

8. The device of claim 1, wherein the device is architecturally configured as a back-side illuminated optoelectronic device.

9. The device of claim 1, wherein the surface features are arranged according to a predetermined pattern.

10. The device of claim 9, wherein the predetermined pattern is an at least substantially uniform grid.

11. The device of claim 9, wherein the predetermined pattern is a non-uniform arrangement.

12. A method of making an optoelectronic device, comprising:

creating an array of surface features on at least a portion of a surface of a support substrate using shallow trench isolation etching; and bonding the array of surface features between the support substrate and a semiconductor layer.

13. The method of claim 12, wherein bonding the array of surface features between the support substrate and the semiconductor layer further includes:

depositing a first bonding layer onto the semiconductor layer; and bonding the first bonding layer to a second bonding layer disposed on the support substrate.

14. An optoelectronic device having enhanced absorption of electromagnetic radiation, comprising:

a semiconductor layer coupled to a support substrate;

a first bonding layer coupled between the semiconductor layer and the support substrate;

a second bonding layer positioned between the first bonding layer and the support substrate;

a reflector layer disposed between the first bonding layer and the second bonding layer; and an array of shallow trench isolation surface features positioned between the semiconductor layer and the support substrate, the surface features positioned to interact with electromagnetic radiation that passes through the semiconductor layer, wherein the surface features are formed in the support substrate.

15. The device of claim 14, wherein the semiconductor layer is single crystal silicon.

16. The device of claim 14, wherein the first bonding layer is coupled between the support substrate and the surface features.

17. The device of claim 14, wherein the surface features have an at least substantially uniform height.

18. The device of claim 14, wherein the surface features are not uniform in height.

19. The device of claim 14, further comprising a device layer coupled to the semiconductor layer on a side opposite the surface features.

20. The device of claim 14, wherein the device is architecturally configured as a front-side illuminated optoelectronic device.

21. The device of claim 14, wherein the device is architecturally configured as a back-side illuminated optoelectronic device.

22. The device of claim 14, wherein the surface features are arranged according to a predetermined pattern.

23. The device of claim 22, wherein the predetermined pattern is an at least substantially uniform grid.

24. The device of claim 22, wherein the predetermined pattern is a non-uniform arrangement.

* * * * *